(12) United States Patent
Murakami et al.

(10) Patent No.: US 9,680,086 B2
(45) Date of Patent: Jun. 13, 2017

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Shunsuke Murakami, Kawasaki (JP); Takayuki Watanabe, Yokohama (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 436 days.

(21) Appl. No.: 14/354,097

(22) PCT Filed: Oct. 22, 2012

(86) PCT No.: PCT/JP2012/077817
§ 371 (c)(1),
(2) Date: Apr. 24, 2014

(87) PCT Pub. No.: WO2013/062120
PCT Pub. Date: May 2, 2013

(65) Prior Publication Data
US 2014/0265729 A1    Sep. 18, 2014

(30) Foreign Application Priority Data

Oct. 26, 2011 (JP) ................................ 2011-235205
Oct. 4, 2012 (JP) ................................ 2012-221969

(51) Int. Cl.
*H01L 41/08* (2006.01)
*H01L 41/187* (2006.01)
(Continued)

(52) U.S. Cl.
CPC .......... *H01L 41/1871* (2013.01); *B41J 2/045* (2013.01); *B41J 2/14233* (2013.01);
(Continued)

(58) Field of Classification Search
CPC .................................................. H01L 41/1871
(Continued)

(56) References Cited

U.S. PATENT DOCUMENTS 7,591,543 B2 * 9/2009 Aoki .................... B41J 2/14233
310/358
7,857,431 B2 * 12/2010 Fukui ...................... B41J 2/161
347/68
(Continued)

FOREIGN PATENT DOCUMENTS

CN     101291889 A     10/2008
CN     101834269 A      9/2010
(Continued)

OTHER PUBLICATIONS

Zeng, et al., "Ferroelectric and Piezoelectric Properties of Na1-xBaxNb1-xTixO3 Ceramics", Journal of the American Ceramic Society, 2006, vol. 89, No. 9, Sep. 1, 2006 (Sep. 1, 2006), pp. 2828-2832.
(Continued)

*Primary Examiner* — Thomas Dougherty
*Assistant Examiner* — Karen B Addison
(74) *Attorney, Agent, or Firm* — Canon U.S.A., Inc., IP Division

(57) ABSTRACT

The present invention provides a piezoelectric material which has excellent insulating and piezoelectric properties and which contains no lead and potassium and also provides a piezoelectric element and a multilayered piezoelectric element each using the above piezoelectric material. The piezoelectric material is a perovskite-type metal oxide represented by the following general formula (1).

$$(1-x)\{(Na_yBa_{1-z})(Nb_yTi_{1-z})O_3\}\text{-}xBiFeO_3 \qquad (1)$$

(Continued)

In the formula, $0 < x \leq 0.015$, $0.80 \leq y \leq 0.95$, $0.85 \leq z \leq 0.95$ are satisfied.

22 Claims, 14 Drawing Sheets

(51) Int. Cl.
| | |
|---|---|
| B41J 2/045 | (2006.01) |
| B41J 2/14 | (2006.01) |
| C04B 35/495 | (2006.01) |
| C04B 35/626 | (2006.01) |
| C04B 35/645 | (2006.01) |
| H01L 41/083 | (2006.01) |
| H01L 41/09 | (2006.01) |
| H02N 2/00 | (2006.01) |
| H02N 2/10 | (2006.01) |
| H02N 2/16 | (2006.01) |

(52) U.S. Cl.
CPC ...... *C04B 35/495* (2013.01); *C04B 35/62685* (2013.01); *C04B 35/6455* (2013.01); *H01L 41/083* (2013.01); *H01L 41/0973* (2013.01); *H01L 41/1873* (2013.01); *H02N 2/0005* (2013.01); *H02N 2/106* (2013.01); *H02N 2/163* (2013.01); *B41J 2202/03* (2013.01); *C04B 2235/3201* (2013.01); *C04B 2235/3215* (2013.01); *C04B 2235/3232* (2013.01); *C04B 2235/3236* (2013.01); *C04B 2235/3251* (2013.01); *C04B 2235/3274* (2013.01); *C04B 2235/3298* (2013.01); *C04B 2235/667* (2013.01); *C04B 2235/768* (2013.01); *C04B 2235/77* (2013.01); *C04B 2235/81* (2013.01)

(58) Field of Classification Search
USPC ............ 310/323.02, 364, 365, 328, 358; 252/62.9 PZ; 347/68
IPC ............ H01L 41/187; H02N 2/00; B41J 2/045
See application file for complete search history.

(56) References Cited

U.S. PATENT DOCUMENTS

| | | | |
|---|---|---|---|
| 7,896,480 B2* | 3/2011 | Kazama | B41J 2/14233 347/68 |
| 2012/0043853 A1* | 2/2012 | Watanabe | C04B 35/495 310/311 |

FOREIGN PATENT DOCUMENTS

| | | |
|---|---|---|
| JP | 2009-227535 A | 10/2009 |
| WO | 2010/126158 A2 | 11/2010 |

OTHER PUBLICATIONS

Kumar et al., "Dielectric relaxation in Ba0.96Bi0.04Ti0.96Fe0.0403", Journal of Applied Physics, vol. 84, No. 12, Dec. 15, 1998 (Dec. 15, 1998), pp. 6811-6814.

Ruzhong Zuo, et al., Na0.5 Nbo3-BiFeo3 Lead-free piezoelectric ceramics; Journal of Physics and Chemistry of Solids 69 (2008) 230-235.

H. Nagata, et al., Lead-Free Piezoelectric Ceramics of (Bi1/2NA1/2) Tio3-BiFeo3 System; Key Engineering Materials vols. 169-170 (1999) pp. 37-40.

Jiang Ming-Hong, et al., Sintering Processing and Piezoelectric Properties of K0.5 Na0.5 NbO3-BiFeO3 Lead-free Ceramics; Journal of Inorganic Materials vol. 24, No. 6 Nov. 2009.

Zhou Taosherg, et al., Low Temperature sintering piezoelectric ceramics and their applications; Journal of Hubei University (Natural Science Edition) vol. 22 No. 1, Mar. 2000.

* cited by examiner

PIEZOELECTRIC MATERIAL, PIEZOELECTRIC ELEMENT, AND ELECTRONIC APPARATUS

TECHNICAL FIELD

The present invention relates to a piezoelectric material and more particularly relates to a lead-free piezoelectric material. In addition, the present invention also relates to a piezoelectric element and a multilayered piezoelectric element, each of which uses the piezoelectric material described above; a method for manufacturing a multilayer piezoelectric element; and a liquid discharge head, a liquid discharge device, an ultrasonic motor, an optical apparatus, a vibration device, a dust removing device, an imaging apparatus, and an electronic apparatus.

BACKGROUND ART

Lead zirconate titanate, which contains lead, is a representative piezoelectric material and has been used in various piezoelectric devices, such as an actuator, an oscillator, a sensor, and a filter. However, it has been pointed out that when a lead-containing piezoelectric device is once discarded and exposed to acid rain, a lead component contained in a piezoelectric material is dissolved therein and absorbed in the soil, and thereby the ecological system is probably adversely influenced. Hence, in order to realize a lead-free piezoelectric device, research and development of lead-free piezoelectric materials has been energetically carried out.

According to NPL 1, it was found that when a small amount of barium titanate is solid-solved in sodium niobate, which is an antiferroelectric substance, sodium niobate is changed into a ferroelectric substance. Furthermore, NPL 1 has disclosed the remanent polarization, coercive field, piezoelectric constant, and electromechanical coupling coefficient, which are obtained when a composition containing barium titanate at a concentration of 5% to 20% is sintered at 1,200° C. to 1,280° C. A lead-free material disclosed in NPL 1 also contains no potassium which makes sintering difficult and degrades humidity resistance. Furthermore, the Curie temperature of the material disclosed in NPL 1 is higher than the Curie temperature (110° C. to 120° C.) of barium titanate, which is a representative lead-free piezoelectric material. NPL 1 also has disclosed that the Curie temperature of a composition $(Na_{0.9}Ba_{0.1})(Nb_{0.9}Ti_{0.1})O_3$ at which a maximum piezoelectric constant $d_{33}$ of 143 pC/N can be obtained is 230° C.

In addition, PTL 1 has disclosed that when cobalt is added to a piezoelectric ceramic which is a solid solution of sodium niobate and barium titanate, the piezoelectric constant is improved. In addition, PTL 1 has also disclosed that among the piezoelectric materials of PTL 1, at least one sample is included which is difficult to be polarized due to a low insulating property of $10^6 \Omega$ or less.

CITATION LIST

Patent Literature

PTL 1 Japanese Patent Laid-Open No. 2009-227535 Non Patent Literature

NPL 1 J. T. Zeng et al., Journal of the American Ceramic Society, 2006, vol. 89, pp. 2,828 to 2,832

SUMMARY OF INVENTION

Technical Problem

According to related techniques, in order to improve the piezoelectric constant of a piezoelectric material obtained by solid-solving barium titanate in sodium niobate (hereinafter referred to as "NN-BT)), sintering must be performed at a high temperature of 1,200° C. to 1,280° C., and in addition, cobalt, which is expensive and is also regarded as a harmful substance, must be inevitably used. Furthermore, there has been a problem in that the insulating resistance of NN-BT containing cobalt is not always high.

The present invention was made in order to solve the problems as described above and provides a piezoelectric material which contains no lead, potassium, and cobalt, has a Curie temperature of 100° C. or more, can be sintered at a low temperature of less than 1,200° C., and has excellent insulating and piezoelectric properties. In addition, the present invention provides a piezoelectric element and a multilayered piezoelectric element, each of which uses the lead-free piezoelectric material described above, and also provides a liquid discharge head, an ultrasonic motor, and a dust removing device, each of which uses the piezoelectric element or the multilayered piezoelectric element described above.

Solution to Problem

A piezoelectric material according to a first aspect of the present invention which solves the problems described above is a piezoelectric material comprising a perovskite-type metal oxide represented by the following general formula (1).

$$(1-x)\{(Na_yBa_{1-y})(Nb_zTi_{1-z})O_3\}\text{-}xBiFeO_3 \qquad (1)$$

(In the formula, $0 < x \leq 0.015$, $0.80 \leq y \leq 0.95$, and $0.85 \leq z \leq 0.95$ hold.)

A piezoelectric element according to a second aspect of the present invention comprises a first electrode, a piezoelectric material, and a second electrode, and the piezoelectric material is the piezoelectric material according to the first aspect of the present invention.

A multilayered piezoelectric element according to a third aspect of the present invention comprises piezoelectric material layers and electrode layers including at least one internal electrode, the piezoelectric material layers and the electrode layers being alternately laminated to each other. In the multilayered piezoelectric element, the piezoelectric material layers include the piezoelectric material described above.

A liquid discharge head according to a fourth aspect of the present invention comprises a liquid chamber communicating with an ejection port; a vibration portion; and the piezoelectric element or the multilayered piezoelectric element described above.

A liquid discharge device according to a fifth aspect of the present invention comprises a transport unit for a recording medium and the liquid discharge head described above.

An ultrasonic motor according to a sixth aspect of the present invention comprises a vibration body which includes the piezoelectric element or the multilayered piezoelectric element described above; and a moving body in contact with the vibration body.

An optical apparatus according to a seventh aspect of the present invention comprises the ultrasonic motor described above in a drive portion.

A vibration device according to an eighth aspect of the present invention comprises a vibration body; and the piezoelectric element or the multilayered piezoelectric element described above.

A dust removing device according to a ninth aspect of the present invention comprises the vibration device described above in a vibration portion.

An imaging apparatus according to a tenth aspect of the present invention comprises the above dust removing device and an imaging unit having a light receiving surface. In the imaging apparatus, the vibration body in the dust removing device and the light receiving surface of the imaging unit are sequentially provided on the same axis.

An electronic apparatus according to an eleventh aspect of the present invention comprises a piezoelectric acoustic component including the piezoelectric element or the multilayered piezoelectric element described above.

Advantageous Effects of Invention

The present invention provides a piezoelectric material which contains no lead, potassium, and cobalt, which has a Curie temperature of 100° C. or more, which can be sintered at a low temperature of less than 1,200° C., and which has excellent insulating and piezoelectric properties. In addition, the present invention provides a piezoelectric element and a multilayered piezoelectric element, each of which uses the piezoelectric material described above, and also provides a liquid discharge head, a liquid discharge device, an ultrasonic motor, an optical apparatus, a vibration device, a dust removing device, an imaging apparatus, and an electronic apparatus, each of which uses the piezoelectric element or the multilayered piezoelectric element described above.

The piezoelectric material of the present invention has a small load on the environment since lead is not used. In addition, since potassium is not used, excellent sintering properties and humidity resistance can also be obtained.

DESCRIPTION OF EMBODIMENTS

Figure 1:
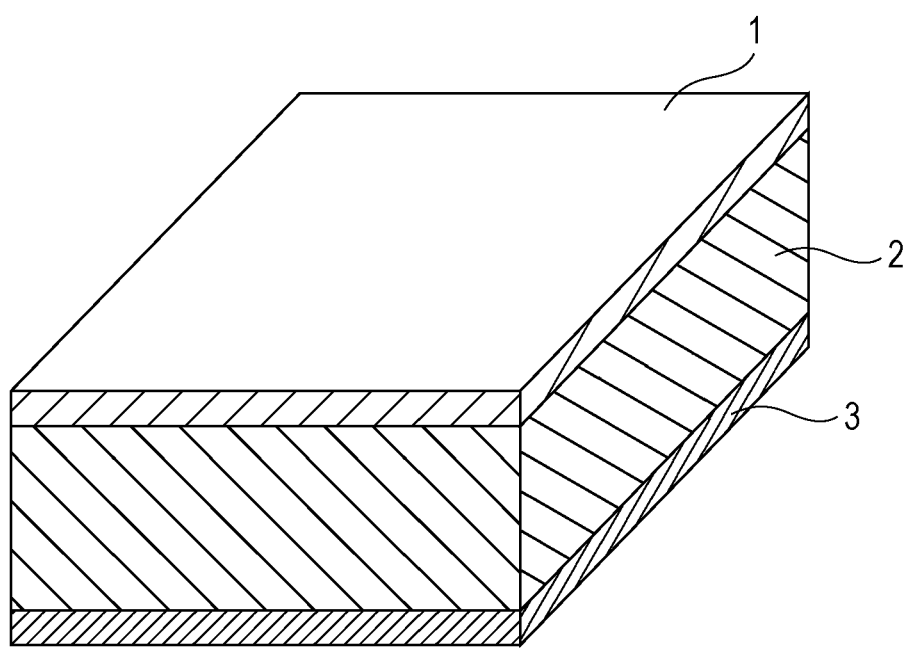
FIG. 1 is a schematic view showing one embodiment of the structure of a piezoelectric element of the present invention.

Hereinafter, embodiments of the present invention will be described.

The present invention provides a lead-free piezoelectric material having excellent piezoelectric and insulating properties by using NN-BT as a base material. In addition, the piezoelectric material of the present invention can be applied to various applications, such as a capacitor, a memory, and sensor, by using the properties as a dielectric material.

The piezoelectric material of the present invention includes a perovskite-type metal oxide represented by the following general formula (1).

$$(1-x)\{(Na_yBa_{1-z})(Nb_zTi_{1-z})O_3\}\text{-}xBiFeO_3 \qquad (1)$$

(In the formula, $0<x\leq0.015$, $0.80\leq y\leq0.95$, and $0.85\leq z\leq0.95$ hold.)

The above general formula (1) indicates a metal oxide composition of (1−x) moles of $\{(Na_yBa_{1-z})(Nb_zTi_{1-z})O_3\}$ (NN-BT) and x moles of $BiFeO_3$. Although NN-BT of the above general formula (1) indicates a solid solution of $NaNbO_3$ and $BaTiO_3$ which is obtained by solid-solving barium titanate in sodium niobate, Na is liable to vaporize in sintering, and hence Na may be deficient with respect to Nb in some cases. In the above general formula (1), in consideration of the case in which Na of the piezoelectric material of the present invention may be deficient, the subscript of Na is denoted by "y" so as to be discriminated from the subscript "z" of Nb.

In addition, although not always required to form a perfect solid solution, when NN-BT and $BiFeO_3$ are uniformly solid-solved with each other to form a single phase of a perovskite-type structure, by a morphotropic phase boundary effect of the orthorhombic structure of NN, the tetragonal structure of BT, and the rhombohedral structure of $BiFeO_3$, the degree of improvement of the piezoelectric constant is increased.

The range of x of the above general formula (1) is more than 0 to 0.015. When x of $BiFeO_3$ is more than 0.015, the Curie temperature is excessively decreased, and as a result, depolarization may occur in some cases by heat generated in a device forming step or in a device operation. On the other hand, even if the amount of $BiFeO_3$ is very small, an effect of improving the insulating resistance and piezoelectric properties can be obtained. The range of x is preferably 0.001 to 0.015 and more preferably 0.001 to 0.013, and when x is in the above range, the effect of improving the piezoelectric constant is higher by 10% or more than that of a composition containing no $BiFeO_3$.

The range of y of the general formula (1) is 0.80 to 0.95. When y of sodium is less than 0.8, sodium is less than 95% of niobium on the stoichiometric basis. In a composition in which sodium is deficient by more than 5%, impurity phases (phases having x-ray diffraction patterns similar to those of $Ba_4Nb_2O_9$, $Ba_6Ti_7Nb_9O_{42}$, $Ba_3Nb_4Ti_4O_{21}$, $Ba_3Nb_{3.2}Ti_5O_{21}$, and the like) are generated, and as a result, the insulating properties of a sample are degraded. In addition, when y of sodium is more than 0.95, the piezoelectric properties are degraded. When y of sodium is in a range of 0.80 to 0.95, the generation of impurity phases can be suppressed, and excellent piezoelectric properties can be obtained. In addition, y is more preferably in a range of 0.80 to 0.90.

The range of z of the general formula (1) is 0.85 to 0.95. When z of niobium is less than 0.85, the Curie temperature is decreased to less than 110° C. On the other hand, when z of niobium is more than 0.95, the piezoelectric properties are degraded. In addition, z is more preferably in a range of 0.85 to 0.90.

In the general formula (1), when the z value is small (such as $z \leq 0.87$), and the x value is large (such as $x \leq 0.013$), although the piezoelectric properties of the piezoelectric material of the present invention are improved, in exchange, the Curie temperature is decreased. In order to prevent the piezoelectric material of the present invention from being depolarized by heating in a device forming step or heat generated in a device operation, as the piezoelectric material of the present invention, a composition having a Curie temperature of 100° C. or more, preferably 110° C. or more, and more preferably 130° C. or more is desirably selected. The Curie temperature of the piezoelectric material of the present invention can be controlled by the composition parameters x, y, and z and the composition uniformity based on the micrometer scale.

In this specification, besides the Curie temperature as defined by the Curie-Weiss Law, a temperature at which the dielectric constant is maximized in the vicinity of a phase transition temperature between the ferroelectric phase and the paraelectric phase (cubic phase) is also defined as the Curie temperature.

In this specification, the perovskite structure indicates a crystal structure represented in general by a chemical formula of $ABO_3$. Elements A and B occupy specific positions called A and B sites, respectively, of a unit cell. In the case of a cubic perovskite structure, the A-site elements occupy 8 corners of the unit cell, the B-site element occupies one body-centered position, and oxygen atoms occupy 6 face-centered positions. The A-site element has a coordination number of 12, and the B-site element has a coordination number of 6.

In order to readily manufacture the piezoelectric material of the present invention and to adjust the properties thereof, barium may be partially replaced with at least one divalent metal element, such as strontium or calcium. As in the case described above, niobium may also be partially replaced with at least one pentavalent metal element, such as tantalum or vanadium.

The piezoelectric material of the present invention has a characteristic composition, and since the form of the piezoelectric material is not limited, any one of a powder, a single crystal, a polycrystalline ceramic, and a film formed on a substrate may be used. In order to manufacture a sintered ceramic of the piezoelectric material of the present invention, a metal oxide, a powdered metal salt, or a liquid thereof, each of which forms a piezoelectric material, may be used as a raw material. In addition, as the raw material, a barium titanate powder, a sodium niobate powder, or a bismuth ferrite powder may also be used.

A compact can be sintered in the air at an ordinary pressure. Besides the process described above, if needed, an electrical heating method, a microwave sintering method, a milliwave sintering method, and a hot isostatic press method may also be used.

Although a sintering temperature is not particularly limited, by an effect of adding $BiFeO_3$ to NN-BT, the piezoelectric material of the present invention can obtain sufficient piezoelectric properties by a low-temperature process. For example, although a ceramic piezoelectric material formed from a related NN-BT cannot obtain sufficient density and piezoelectric properties if a sintering temperature is not 1,280° C. or more, the piezoelectric material of the present invention can be formed into a piezoelectric ceramic having sufficient density and piezoelectric properties at a sintering temperature of approximately 1,100° C. to 1,200° C.

When a crystal grain diameter of the piezoelectric material of the present invention is more than 100 the strength thereof may not be sufficient in cutting and polishing processing in some cases. Hence, the average crystal grain diameter of the piezoelectric material is preferably in a range of 0.3 to 100 μm.

When the piezoelectric material of the present invention is used as a film formed on a substrate, the thickness of the piezoelectric material is preferably 200 nm to 10 μm and more preferably 300 nm to 3 μm. When the thickness of the piezoelectric material is set to 200 nm to a sufficient electromechanical conversion function as a piezoelectric element can be obtained.

A method for laminating the film is not particularly limited. For example, there may be mentioned a chemical solution deposition method (CSD method), a sol-gel method, an organometallic chemical vapor deposition method (MOCVD method), a sputtering method, a pulse laser deposition method (PLD method), a hydrothermal synthesis method, and an aerosol deposition method (AD method). Among those mentioned above, the most preferable lamination method is a chemical solution deposition method or a sputtering method. By a chemical solution deposition method or a sputtering method, a film formation area can be easily increased.

The substrate used for the piezoelectric material of the present invention is preferably a single crystal substrate which is cut and polished along the (001) plane or the (110) plane. When a single crystal substrate which is cut and polished along a specific crystal plane is used, a piezoelectric material film provided on the surface of the substrate can be strongly oriented in the same direction as that of the substrate.

Hereinafter, a piezoelectric element using the piezoelectric material of the present invention will be described.

FIG. 1 is a schematic view showing one embodiment of the structure of a piezoelectric element of the present invention. The piezoelectric element of the present invention is a piezoelectric element having at least a first electrode 1, a piezoelectric material 2, and a second electrode 3, and the piezoelectric material 2 is the piezoelectric material of the present invention.

When the piezoelectric material of the present invention is used for a piezoelectric element having at least a first electrode and a second electrode, the piezoelectric properties of the piezoelectric material can be evaluated. The first electrode and the second electrode are each formed of a conductive layer having a thickness of approximately 5 to 2,000 nm. A material thereof is not particularly limited, and any material generally used for a piezoelectric element may be used. For example, metals, such as Ti, Pt, Ta, Ir, Sr, In, Sn, Au, Al, Fe, Cr, Ni, Pd, Ag, and Cu, and compounds thereof may be mentioned.

The first electrode and the second electrode may be each formed from one type of those mentioned above or may be formed from at least two types thereof laminated to each other. In addition, the first electrode may be formed from the same material as or different from that of the second electrode.

A method for manufacturing the first electrode and the second electrode is not particularly limited, and these electrodes may be formed by baking a metal paste or may be formed, for example, by a sputtering method or a deposition method. In addition, the first electrode and the second electrode may be each patterned to have a desired shape.

In the above piezoelectric element, it is more preferable when the polarization axes are aligned in a predetermined direction. When the polarization axes are aligned in a predetermined direction, the piezoelectric constant of the piezoelectric element is increased.

A polarization method of the piezoelectric element is not particularly limited. A polarization treatment may be performed in the air or in oil. Although the temperature for polarization is preferably 60° C. to 160° C., the optimum conditions are slightly changed depending on the composition of the piezoelectric material forming the element. The electric field applied for the polarization treatment is preferably equal to or more than the coercive field of the material and is in particular 1 to 5 kV/mm.

The piezoelectric constant and the mechanical quality factor of the piezoelectric element can be obtained by calculation from measurement results of a resonant frequency and an antiresonant frequency obtained using a commercially available impedance analyzer based on Standard of Japan Electronics and Information Technology Industries Association (JEITA EM-4501). Hereinafter, this method is called a resonance-antiresonance method.

Next, a multilayered piezoelectric element using the piezoelectric material of the present invention will be described.

The multilayered piezoelectric element of the present invention is a multilayered piezoelectric element in which piezoelectric material layers and electrodes including at least one internal electrode are alternately laminated to each other, and the piezoelectric material layers are each formed of the piezoelectric material of the present invention.

Figure 2A:
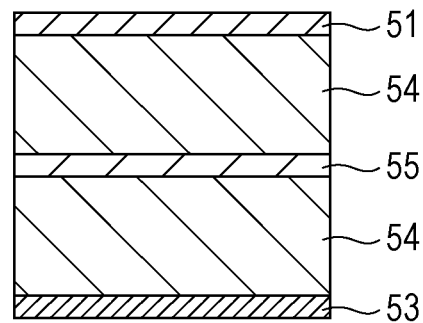
FIGS. 2A and 2B are schematic cross-sectional views each showing one embodiment of the structure of a multilayered piezoelectric element of the present invention.

FIG. 2A is a schematic cross-sectional view showing one embodiment of the structure of the multilayered piezoelectric element of the present invention. The multilayered piezoelectric element of the present invention is formed of piezoelectric material layers 54 and electrodes including at least one internal electrode 55 and is a multilayered piezoelectric element in which piezoelectric material layers and layer-shaped electrodes are alternately laminated to each other, and the piezoelectric material layers 54 are each formed of the piezoelectric material described above. The electrodes may include, besides the internal electrode 55, external electrodes, such as a first electrode 51 and a second electrode 53.

Figure 2B:
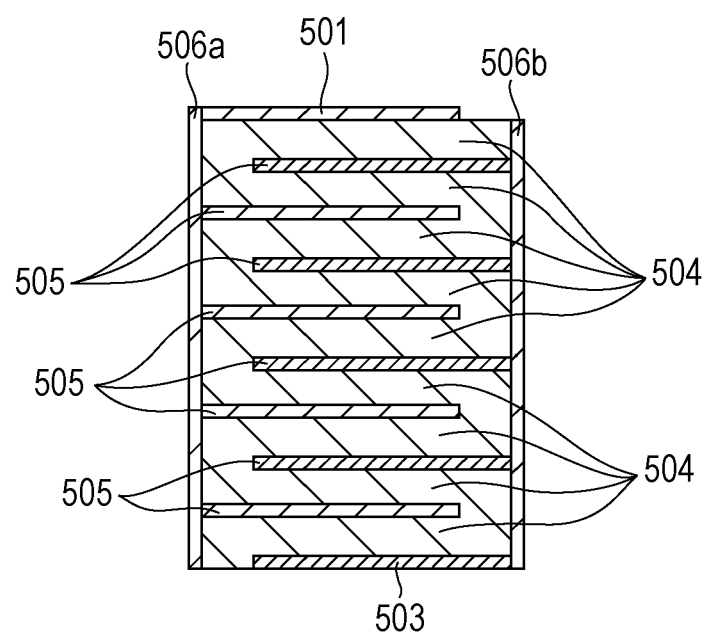

FIG. 2A shows the structure of the multilayered piezoelectric element of the present invention in which the two piezoelectric material layers 54 are laminated to each other with the one internal electrode 55 provided therebetween and the laminate thus formed is sandwiched by the first electrode 51 and the second electrode 53. In addition, as shown in FIG. 2B, the number of the piezoelectric material layers and that of the internal electrodes may be increased, and the numbers thereof are not limited. A multilayered piezoelectric element shown in FIG. 2B has the structure in which 9 pieces of piezoelectric material layers 504 and 8 pieces of internal electrodes 505 are alternately laminated to each other, the laminate thus formed is sandwiched by a first electrode 501 and a second electrode 503, and external electrodes 506a and 506b for short-circuiting internal electrodes alternately formed at the respective sides are provided.

The sizes and the shapes of the internal electrode 55 and the first and the second electrodes 51 and 53 are not necessarily the same as those of the piezoelectric material layer 54 and may be divided into plural portions. As in the case described above, the sizes and the shapes of the internal electrode 505 and the first and the second electrodes 501 and 503 are not necessarily the same as those of the piezoelectric material layer 504 and may be divided into plural portions.

The internal electrodes 55 and 505, the first electrodes 51 and 501, the second electrodes 53 and 503, and the external electrodes 506a and 506b are each formed of a conductive layer having a thickness of approximately 5 to 2,000 nm. The material thereof is not particularly limited, and any materials generally used for piezoelectric elements may be used. For example, metals, such as Ti, Pt, Ta, Ir, Sr, In, Sn, Au, Al, Fe, Cr, Ni, Pd, Ag, and Cu, and compounds thereof may be mentioned. The internal electrodes 55 and 505, the first electrodes 51 and 501, the second electrodes 53 and 503, and the external electrodes 506a and 506b each may be formed from one or a mixture of those mentioned above or an alloy containing at least two of the metals mentioned above or may be formed by laminating at least two of those mentioned above. In addition, the plural electrodes may be formed from different materials. In view of inexpensive electrode materials, the internal electrodes 55 and 505 each preferably contain Ni as a primary component. In the multilayered piezoelectric element of the present invention, it is preferable that the internal electrode include Ag and Pd, and a weight ratio M1/M2 of a content M1 of the Ag to a content M2 of the Pd be in a range of 1.5 to 9.0. The weight ratio M1/M2 is more preferably in a range of 2.3 to 4.0. When the weight ratio M1/M2 is less than 1.5, a sintering temperature of the internal electrode is unfavorably increased. On the other hand, when the weight ratio M1/M2 is more than 9.0, since the internal electrode is formed into island shapes, irregularities are unfavorably generated in the surface thereof.

As shown in FIG. 2B, a plurality of electrodes including the internal electrodes 505 may be short-circuited to each other in order to make the phases of drive voltages coincide with each other. For example, the structure may be mentioned in which the internal electrodes 505 are alternately short-circuited to the first electrode 501 and the second electrode 503. In addition, the form of short-circuiting between the electrodes is not limited. For example, an electrode or a wire may be provided on each side surface of the multilayered piezoelectric element, or after a through hole penetrating the piezoelectric material layers 504 is provided at each side, a conductive material is provided therein so as to short-circuit between the electrodes.

Figure 3A:
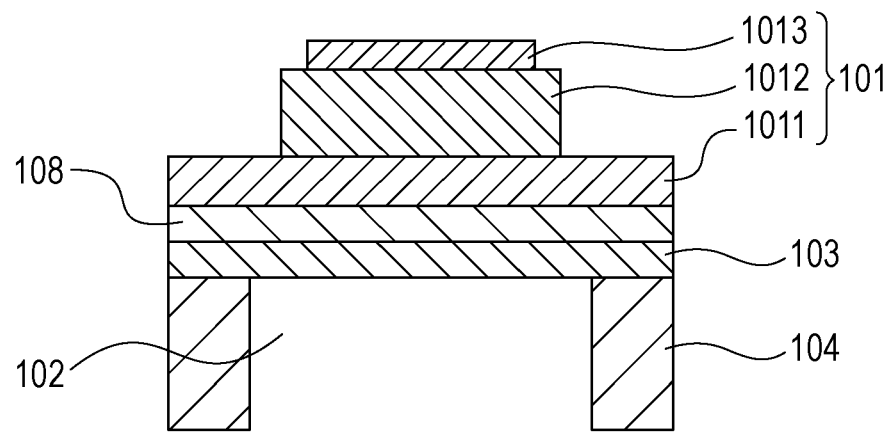
FIGS. 3A and 3B are schematic views each showing one embodiment of the structure of a liquid discharge head of the present invention.
Figure 3B:
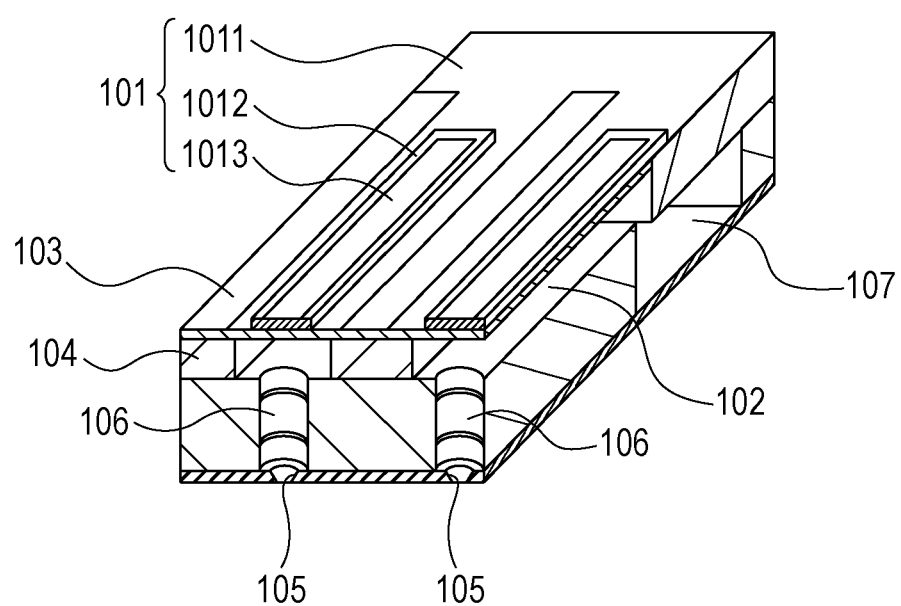

A liquid discharge head of the present invention has at least a liquid chamber communicating with an ejection port, a vibration portion, and the piezoelectric element or the multilayered piezoelectric element. FIGS. 3A and 3B are schematic views each showing one embodiment of the structure of the liquid discharge head of the present invention. As shown in FIGS. 3A and 3B, the liquid discharge head of the present invention is a liquid discharge head having a piezoelectric element 101 of the present invention. The piezoelectric element 101 is a piezoelectric element having at least a first electrode 1011, a piezoelectric material 1012, and a second electrode 1013. The piezoelectric material 1012 is patterned as shown in FIG. 3B, if needed. FIG. 3B is a schematic view of the liquid discharge head. The liquid discharge head has an ejection port 105, an individual liquid chamber 102, a communicating hole 106 connecting between the individual liquid chamber 102 and the ejection port 105, a liquid chamber partition 104, a common liquid chamber 107, a vibration plate 103, and a the piezoelectric element 101. In the figure, although the piezoelectric element 101 has a rectangular shape, the shape thereof may also be an oval, a circle, a parallelogram, or the like. In general, the piezoelectric material 1012 has a shape along the shape of the individual liquid chamber 102. The piezoelectric element 101 and the vicinity thereof included in the liquid discharge head of the present invention will be described in detail with reference to FIG. 3A. FIG. 3A is a cross-sectional view of the piezoelectric element shown in FIG. 3B taken along a width direction thereof. Although the cross-section of the piezoelectric element 101 is shown by a rectangular shape, the cross-section thereof may be either a trapezoid or an inverted trapezoid. In the figure, the first electrode 1011 and the second electrode 1013 are used as a lower electrode and an upper electrode, respectively. However, the arrangement of the first electrode 1011 and the second electrode 1013 is not limited thereto. For example, the first electrode 1011 may be used as a lower electrode or an upper electrode. As in the case described above, the second electrode 1013 may be used as an upper electrode or a lower electrode. In addition, a buffer layer 108 may be provided between the vibration plate 103 and the lower electrode. Although these differences of names are determined by different methods for manufacturing a device, the effect of the present invention can be obtained in both cases. In the liquid discharge head described above, the vibration plate 103 is moved up and down by expansion and contraction of the piezoelectric material 1012, and hence a pressure is applied to a liquid in the individual liquid chamber 102. As a result, a liquid is discharged from the ejection port 105. The liquid discharge head of the present invention can be used for printer application and manufacturing of an electronic device. The thickness of the vibration plate 103 is 1.0 to 15 µm and preferably 1.5 to 8 µm. Although a material for the vibration plate is not limited, Si is preferably used. Si used for the vibration plate may be doped with boron or phosphorus. In addition, the buffer layer and the electrode on the vibration plate may function as a part of the vibration plate. The thickness of the buffer layer 108 is 5 to 300 nm and preferably 10 to 200 nm. The size of the ejection port 105 is 5 to 40 µm in terms of the diameter of a circle. The shape of the ejection port 105 may be a circle or may be a star shape, a polygonal shape, a triangle shape, or the like.

Next, a liquid discharge device of the present invention will be described. The liquid discharge device of the present invention has a transport unit of a recording medium and the liquid discharge head described above.

Figure 4:
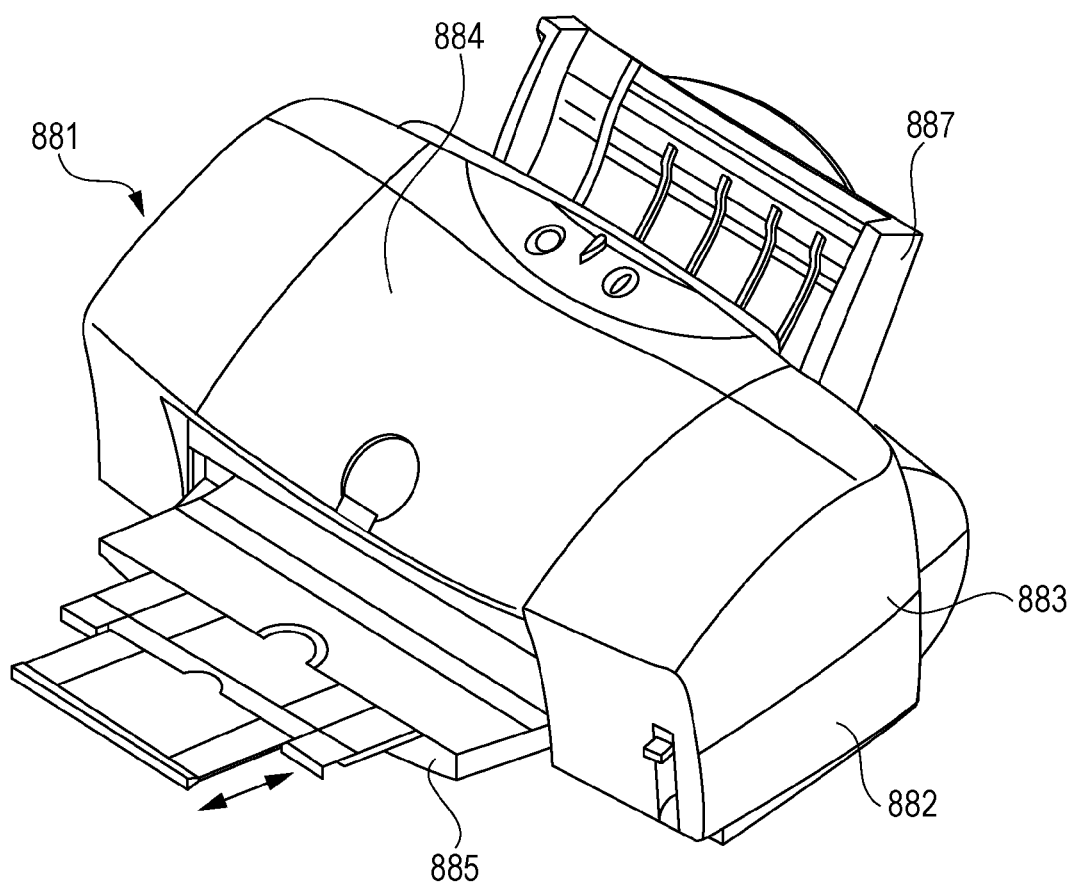
FIG. 4 is a schematic view showing one embodiment of a liquid discharge device of the present invention.
Figure 5:
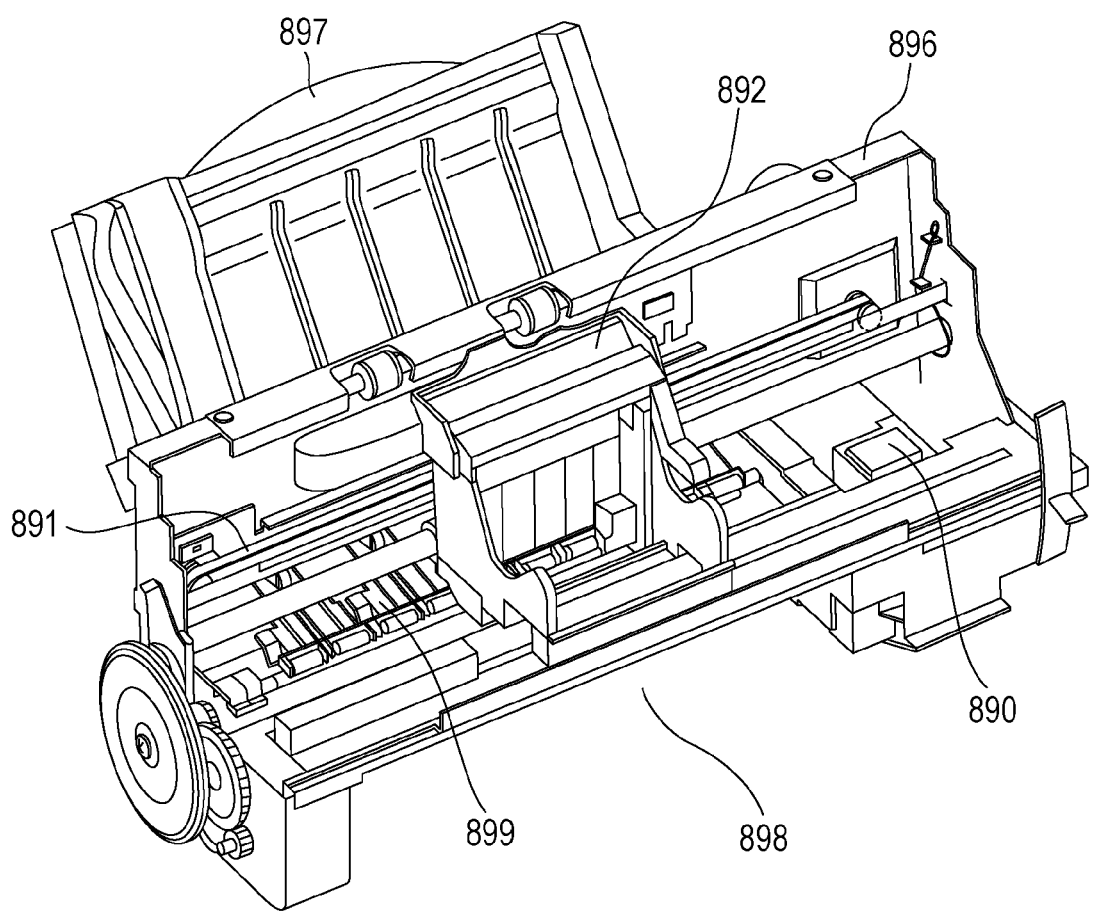
FIG. 5 is a schematic view showing one embodiment of the liquid discharge device of the present invention.

As one example of the liquid discharge device of the present invention, an ink jet recording device shown in FIGS. 4 and 5 may be mentioned. A liquid discharge device (ink jet recording device) 881 shown in FIG. 5 is in the state in which exteriors 882 to 885 and 887 shown in FIG. 4 are dismounted. The ink jet recording device 881 has an automatic feed portion 897 to automatically feed recording paper as a recording medium into a device main body 896. In addition, the ink jet recording device 881 also has a transport unit 899 which guides recording paper fed from the automatic feed portion 897 to a predetermined recording position and then to an ejection port 898 from the recording position, a recording portion 891 which performs recording on the recording paper transported to the recording position, and a recovery portion 890 which performs a recovery treatment on the recording portion 891. The recording portion 891 houses the liquid discharge head of the present invention and is provided with a carriage 892 which is reciprocally moved on a rail.

In such a ink jet recording device, when the carriage 892 is moved on the rail by an electrical signal sent from a computer, and a drive voltage is applied to the electrodes holding the piezoelectric material therebetween, the piezoelectric material is displaced. By this displacement of the piezoelectric material, the individual liquid chamber 102 is pressurized through the vibration plate 103 shown in FIG. 3B to discharge an ink from the ejection port 105, so that printing is performed. In the liquid discharge device of the present invention, a liquid can be uniformly discharged at a high discharge rate, and reduction in size of the device can be achieved.

Although the printer is described above by way of example, besides printing devices, such as ink jet recording devices including a facsimile, a multifunction apparatus, and a copying machine, the liquid discharge device of the present invention can be applied to industrial liquid discharge devices, printing apparatuses for objects, and the like.

Figure 6A:
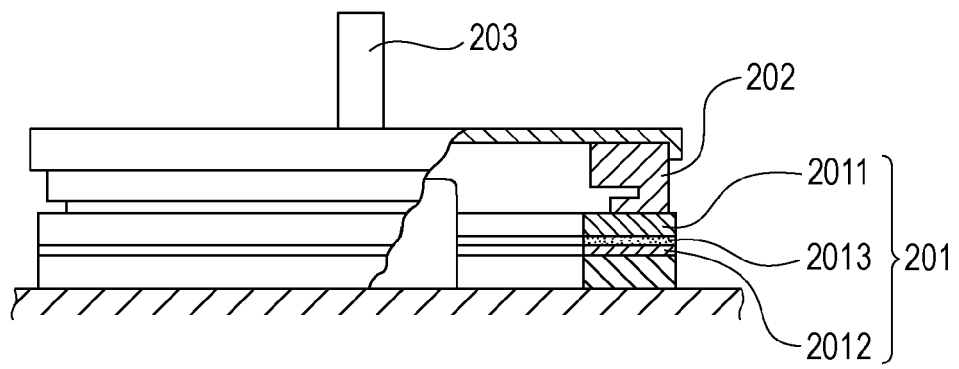
FIGS. 6A and 6B are schematic views each showing one embodiment of the structure of an ultrasonic motor of the present invention.
Figure 6B:
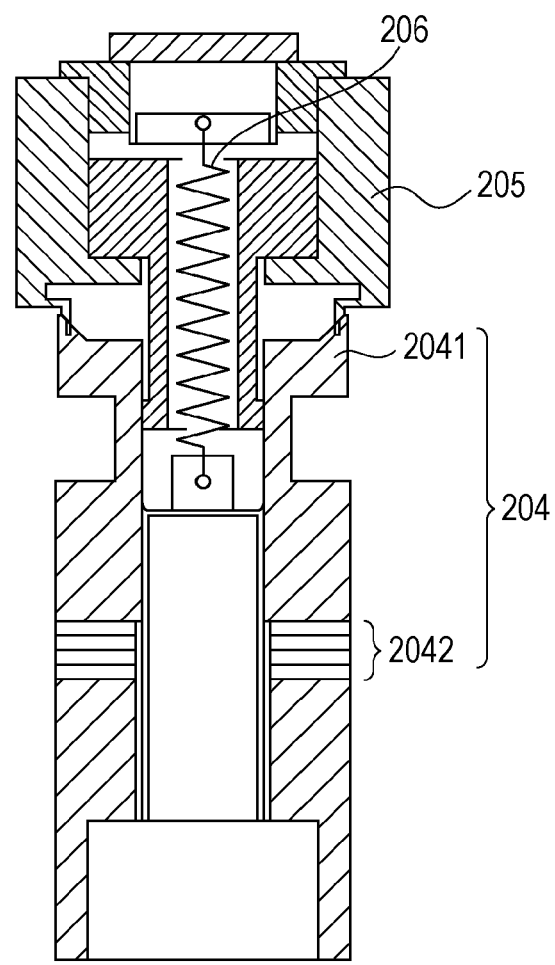

An ultrasonic motor of the present invention has at least a vibration body including the piezoelectric element or the multilayered piezoelectric element and a moving body in contact with the vibration body. FIGS. 6A and 6B are schematic views each showing one embodiment of the structure of the ultrasonic motor of the present invention. An ultrasonic motor of the present invention is shown in FIG. 6A which includes a piezoelectric element formed of a single plate. The ultrasonic motor has a vibrator 201, a rotor 202 in contact with a sliding surface of the vibrator 201 with a pressure applied by a pressure spring (not shown), and an output shaft 203 provided integrally with the rotor 202. The vibrator 201 is formed of a metal elastic ring 2011, a piezoelectric element 2012 of the present invention, and an organic adhesive 2013 (such as an epoxy or an acrylic type) adhering the piezoelectric element 2012 to the elastic ring 2011. The piezoelectric element 2012 of the present invention is formed of a piezoelectric material provided between a first electrode and a second electrode (which are not shown in the figure). If a two-phase alternating voltage with a phase different of π/2 is applied to the piezoelectric element of the present invention, a bending traveling wave is generated in the vibrator 201, and each point on the sliding surface of the vibrator 201 performs an elliptic movement. If the rotor 202 is in pressure contact with the sliding surface of this vibrator 201, the rotor 202 receives a frictional force from the vibrator 201 and rotates in a direction opposite to that of the bending traveling wave. A driven body not shown in the figure is joined to the output shaft 203 and is driven by a rotative force of the rotor 202. When a voltage is applied to the piezoelectric material, the piezoelectric material is expanded and contracted by a piezoelectric transverse effect. When an elastic body, such as a metal, is joined to a piezoelectric element, the elastic body is warped by expansion and contraction of the piezoelectric material. The type of ultrasonic motor described above is an ultrasonic motor which uses this principle. Next, an ultrasonic motor including a piezoelectric element of a laminate structure will be described by way of example with reference to FIG. 6B. A vibrator 204 is formed of a multilayered piezoelectric element 2042 provided between cylindrical metal elastic bodies 2041. The multilayered piezoelectric element 2042 is an element formed of piezoelectric materials (not shown) laminated to each other and has a first electrode and a second electrode on laminate external surfaces and inner electrodes on laminate internal surfaces. The metal elastic bodies 2041 are joined to each other with a bolt to fix the piezoelectric element 2042 therebetween, thereby forming the vibrator 204. By applying alternating voltages having different phases to the piezoelectric element 2042, the vibrator 204 excites two vibrations orthogonal to each other. These two vibrations are synthesized into a circular vibration to drive a front portion of the vibrator 204. In addition, a circumferential groove is formed in an upper portion of the vibrator 204 so as to increase the displacement of the vibration for the drive. A rotor 205 is in pressure contact with the vibrator 204 by a pressure spring 206 to obtain a frictional force for the drive. The rotor 205 is rotatably supported by a bearing.

Next, an optical apparatus of the present invention will be described. The optical apparatus of the present invention has the ultrasonic motor described above in a drive portion.

Figure 7A:
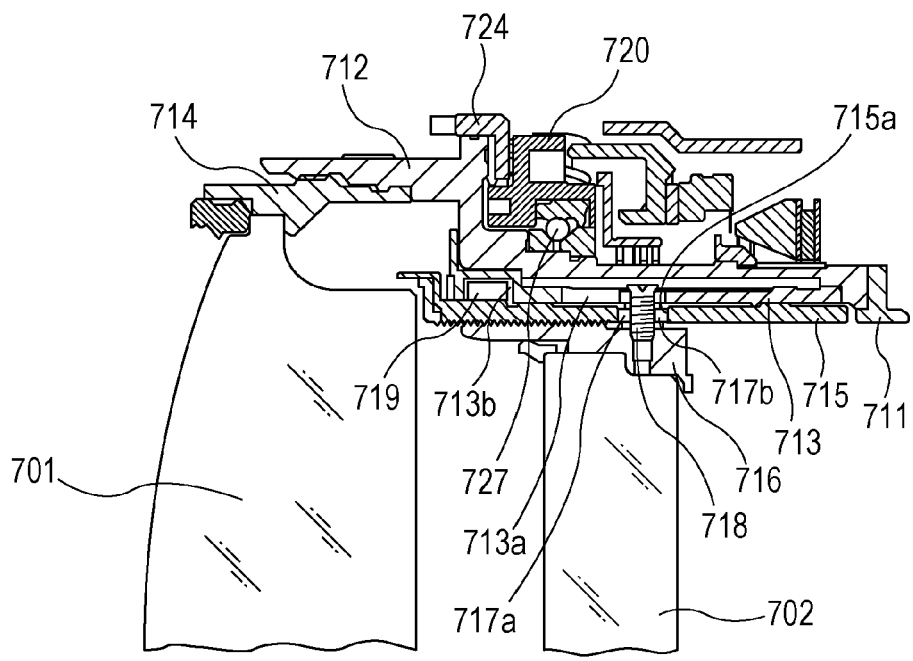
FIGS. 7A and 7B are schematic views each showing one embodiment of an optical apparatus of the present invention.
Figure 7B:
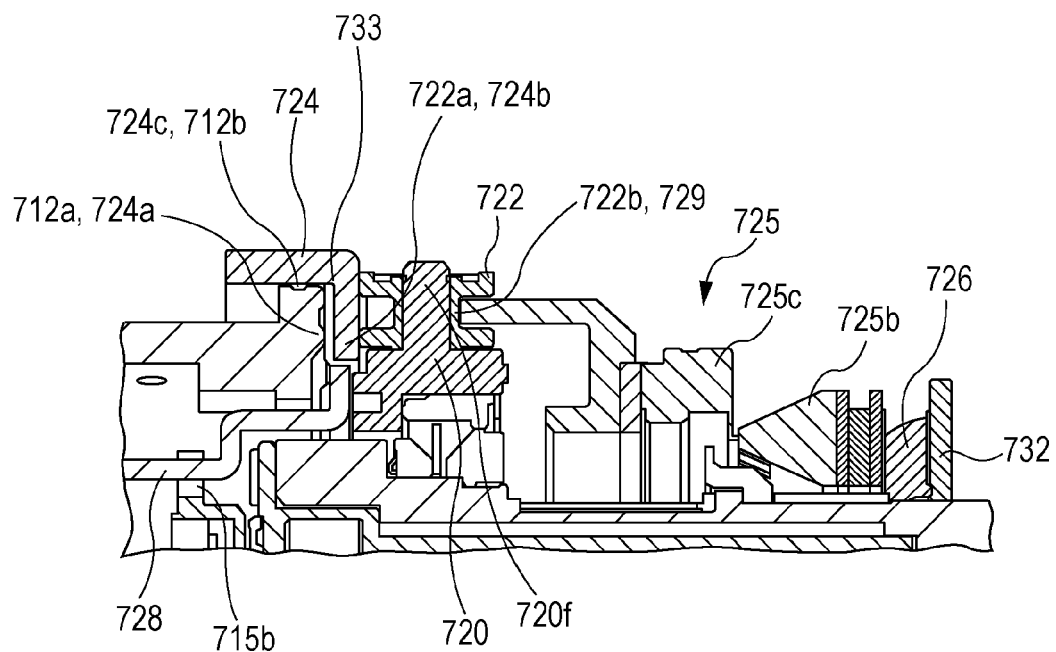
Figure 8:
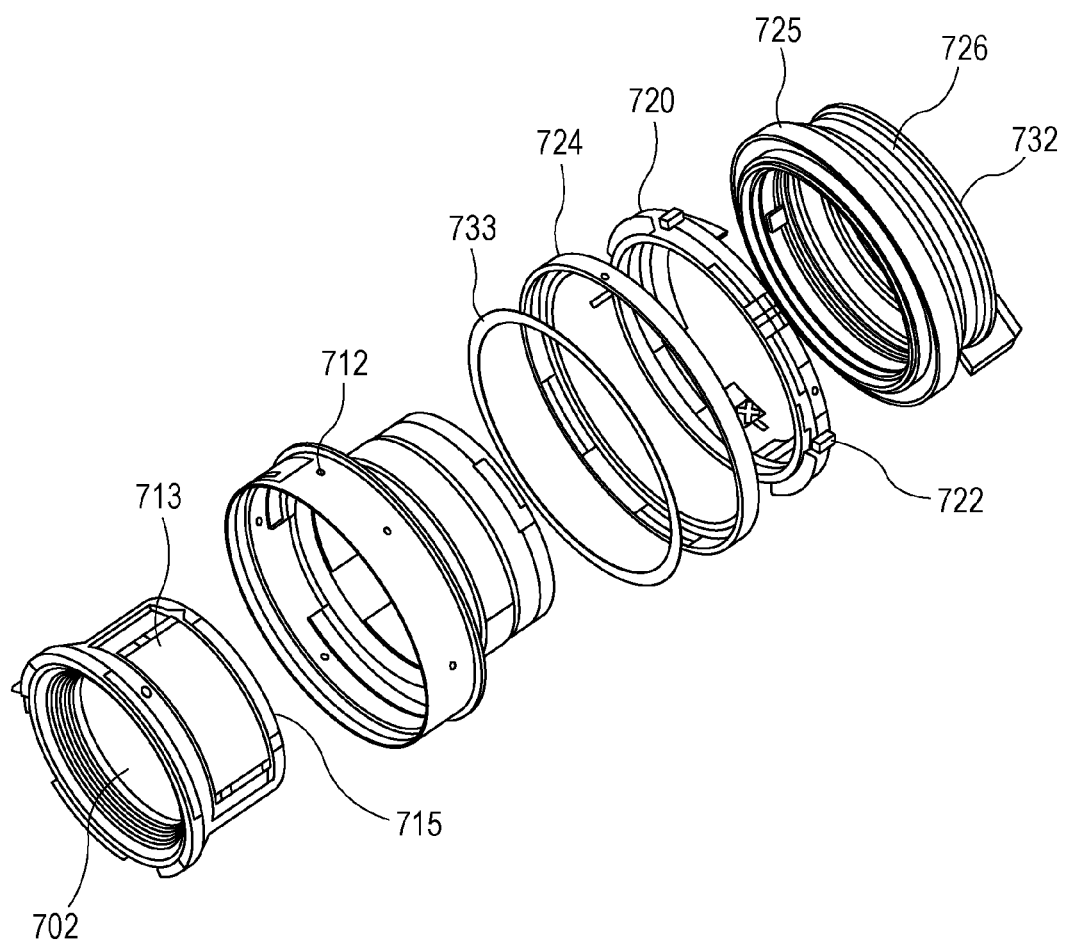
FIG. 8 is a schematic view showing one embodiment of the optical apparatus of the present invention.

FIGS. 7A and 7B are primary cross-sectional views each showing a replaceable lens barrel of a single-lens reflex camera which is one example of a preferable embodiment of an imaging apparatus of the present invention. In addition, FIG. 8 is an exploded perspective view of a replaceable lens barrel of a single-lens reflex camera which is one example of a preferable embodiment of the imaging apparatus of the present invention. To a detachable mount 711 to the camera, a fixed barrel 712, a linear guide barrel 713, and a front lens group barrel 714 are fixed. These are fixed members of the replaceable lens barrel.

In the linear guide barrel 713, a linear-drive guide groove 713a for a focus lens 702 in an optical axis direction is formed. To a rear lens group barrel 716 holding the focus lens 702, cam rollers 717a and 717b protruding outside in a diameter direction are fixed by a shaft screw 718, and the cam roller 717a is fitted in this linear-drive guide groove 713a.

Along the inner circumference of the linear guide barrel 713, a cam ring 715 is rotatably fitted. When a roller 719 fixed to the cam ring 715 is fitted in a circumferential groove 713b of the linear guide barrel 713, the linear guide barrel 713 and the cam ring 715 are restricted from being relatively moved in the optical axis direction. In this cam ring 715, a cam groove 715a for the focus lens 702 is formed, and in the cam groove 715a, the above cam roller 717b is fitted.

At an outer circumference side of the fixed barrel 712, a rotation transmission ring 720 rotatably held by a ball race 727 at a predetermined position with respect to the fixed barrel 712 is arranged. In the rotation transmission ring 720, rollers 722 are each rotatably held by a shaft 720f extending radially from the rotation transmission ring 720, and a large-diameter portion 722a of this roller 722 is in contact with a mount-side end surface 724b of a manual focus ring 724. In addition, a small-diameter portion 722b of the roller 722 is in contact with a joint member 729. The number of the rollers 722 arranged along an outer circumference of the rotation transmission ring 720 at the regular intervals is 6, and these rollers are each arranged so as to satisfy the positional relationship described above.

At an inner diameter portion of the manual focus ring 724, a low friction sheet (washer member) 733 is arranged, and this low friction sheet is provided between a mount-side end surface 712a of the fixed barrel 712 and a front-side end surface 724a of the manual focus ring 724. In addition, an outer diameter of the low friction sheet 733 has a ring shape and is fitted to an inner diameter 724c of the manual focus ring 724, and furthermore, the inner diameter 724c of the manual focus ring 724 is fitted to an outer diameter portion 712b of the fixed barrel 712. The low friction sheet 733 functions to reduce the friction of a rotation ring mechanism configured so that the manual focus ring 724 rotates relative to the fixed barrel 712 around the optical axis. In addition, the large-diameter portion 722a of the roller 722 and the mount-side end surface 724a of the manual focus ring 724 are in pressure contact with each other by a force of a wave washer 726 pressing an ultrasonic motor 725 toward the lens. In addition, as in the case described above, by the force of the wave washer 726 pressing the ultrasonic motor 725 toward the lens, the small-diameter portion 722b of the roller 722 and the joint member 729 are also in pressure contact with each other by an appropriate force applied thereto. The wave washer 726 is restricted from moving in a mount direction by a washer 732 bayonet-mounted to the fixed barrel 712, and a spring force (bias) generated by the wave washer 726 is transmitted to the roller 722 through the ultrasonic motor 725 to generate a force of the manual focus ring 724 pressing the mount-side end surface 712a of the fixed barrel 712. That is, the manual focus ring 724 is assembled so as to be pressed to the mount-side end surface 712a of the fixed barrel 712 with the low friction sheet 733 provided therebetween. Hence, when the ultrasonic motor 725 is rotary driven with respect to the fixed barrel 712 by a control portion not shown in the figure, since the joint member 729 is in frictional contact with the small-diameter portion 722b of the roller 722, the roller 722 is rotated around the shaft 720f. When the roller 722 is rotated around the shaft 720f, as a result, the rotation transmission ring 720 is rotated around the optical axis (autofocus operation).

In addition, when a rotational force around the optical axis is applied from a manual operation input portion (not shown) to the manual focus ring 724, since the mount-side end surface 724b of the manual focus ring 724 is in pressure contact with the large-diameter portion 722a of the roller 722, the roller 722 is rotated around the shaft 720f by the frictional force. When the large-diameter portion 722a of the roller 722 is rotated around the shaft 720f, the rotation transmission ring 720 is rotated around the optical shaft. At this stage, the ultrasonic motor 725 is configured not to be rotated by a friction holding force of a rotor 725c and a stator 725b (manual focus operation).

In the rotation transmission ring 720, two focus keys 728 are provided at positions facing each other so as to be engaged with notch portions 715b provided at the front end of the cam ring 715. Hence, when the autofocus operation or the manual focus operation is performed, and the rotation transmission ring 720 is rotated around the optical axis, the rotation force thereof is transmitted to the cam ring 715 through the focus keys 728. When the cam ring is rotated around the optical axis, the rear lens group barrel 716 restricted from rotation by the cam roller 717a and the linear-drive guide groove 713a is moved to and fro along the cam groove 715a of the cam ring 715 by the cam roller 717b. Accordingly, the focus lens 702 is driven, and the focus operation is performed.

In this case, as the optical apparatus of the present invention, although the replaceable lens barrel of a single-lens reflex camera has been described by way of example, the present invention can be applied to optical apparatuses having an ultrasonic motor in a drive portion regardless of the types of cameras, such as a compact camera, an electronic still camera, and personal digital assistant with a camera.

A vibration device used, for example, for transportation and removal of particles, powders, and liquid droplets has been widely used in electronic apparatuses and the like.

Hereinafter, as one example of a vibration device of the present invention, a dust removing device using the piezoelectric element of the present invention will be described.

A dust removing device of the present invention has a vibration body and the piezoelectric element or the multilayered piezoelectric element.

Figure 9A:
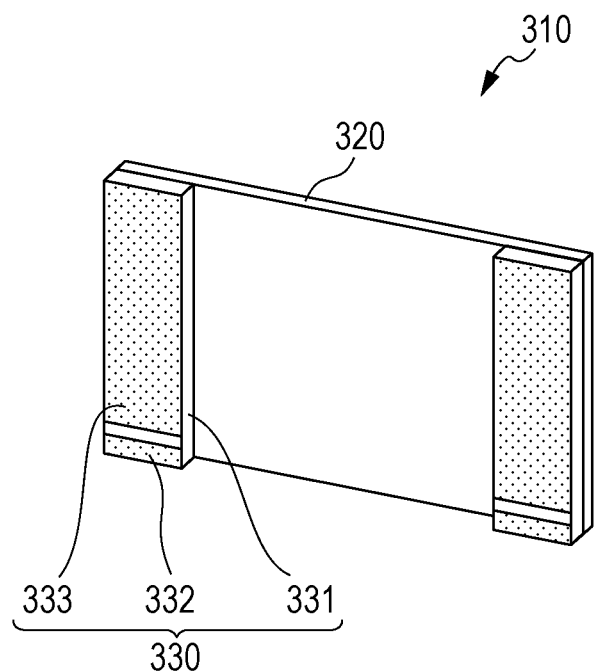
FIGS. 9A and 9B are schematic views each showing one embodiment which uses a vibration device of the present invention as a dust removing device.
Figure 9B:
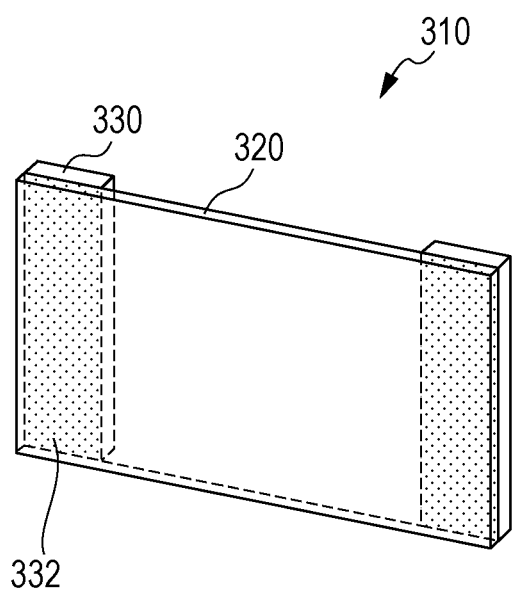

FIG. 9A and FIG. 9B are schematic views showing one embodiment of the dust removing device of the present invention. A dust removing device 310 is formed of plate-shaped piezoelectric elements 330 and a vibration plate 320. The piezoelectric element 330 may be the multilayered piezoelectric element of the present invention. Although a material of the vibration plate 320 is not limited, when the dust removing device 310 is used for an optical device, a translucent material or a light reflection material may be used for the vibration plate 320.

Figure 10:
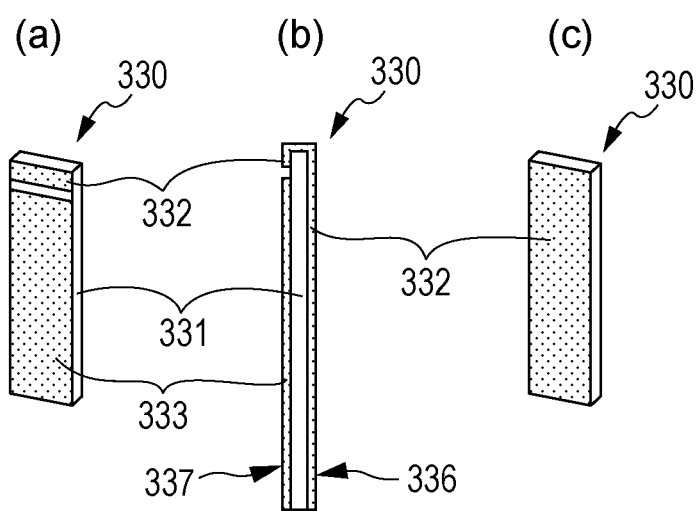
FIG. 10 is a schematic view showing the structure of a piezoelectric element of a dust removing device of the present invention.

FIG. 10 is a schematic view showing the structure of the piezoelectric element 330 shown in FIGS. 9A and 0B. Parts (a) and (c) of FIG. 10 show a front surface and a rear surface of the piezoelectric element 330, respectively, and a part (b) of FIG. 10 shows a side surface thereof. As shown in FIGS. 9A and 9B, the piezoelectric element 330 is formed of a piezoelectric material 331, a first electrode 332, and a second electrode 333, and the first electrode 332 and the second electrode 333 are disposed to face the respective surfaces of the piezoelectric material 331. As in the case shown in FIGS. 9A and 9B, the piezoelectric element 330 may be the multilayered piezoelectric element of the present invention. In this case, the piezoelectric material 331 and the internal electrode are formed to have an alternate structure, and the internal electrodes are alternately short-circuited to the first electrode 332 and the second electrode 333, so that drive waveforms having different phases can be applied to the respective piezoelectric material layers. A front surface of the piezoelectric element 330 shown in the part (c) of FIG. 10 at which the first electrode 332 is provided is represented by a first electrode surface 336, and a front surface of the piezoelectric element 330 shown in the part (a) of FIG. 10 at which the second electrode 333 is provided is represented by a second electrode surface 337.

In this case, the electrode surface of the present invention indicates the surface of the piezoelectric element at which the electrode is provided, and for example, as shown in FIG. 10, the first electrode 332 may be extended to the second electrode surface 337.

The piezoelectric element 330 is fixed to the vibration plate 320 as shown in FIGS. 9A and 9B by fixing the first electrode surface 336 of the piezoelectric element 330 to the plate surface of the vibration plate 320. In addition, a stress is generated between the piezoelectric element 330 and the vibration plate 320 by the drive of the piezoelectric element 330, so that an out-of-plane oscillation is generated in the vibration plate. The dust removing device 310 of the present invention is a device to remove foreign materials, such as dust, adhering to the surface of the vibration plate 320 by the out-of-plane oscillation of the vibration plate 320. The out-of-plane oscillation indicates an elastic vibration which displaces the vibration plate in an optical axis direction, that is, in the thickness direction of the vibration plate.

Figure 11:
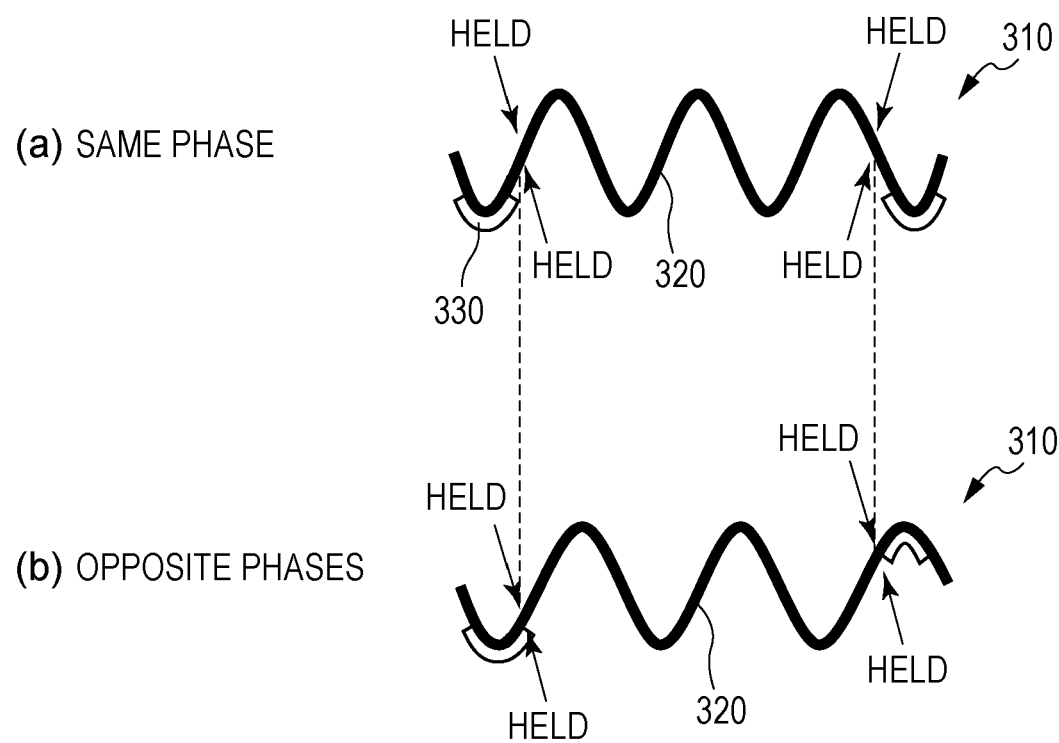
FIG. 11 is a schematic view showing a vibration principle of the dust removing device of the present invention.

FIG. 11 is a schematic view showing a vibration principle of the dust removing device 310 of the present invention. The part (a) of FIG. 11 shows the state in which alternating electric fields having the same phase are applied to the pair of piezoelectric elements 330 located in a right to left direction to generate the out-of-plane oscillation in the vibration plate 320. The polarization direction of the piezoelectric material forming the above pair of piezoelectric elements 330 is the same as the thickness direction of the piezoelectric element 330, and the dust removing device 310 is driven by the seventh vibration mode. The part (b) of FIG. 11 shows the state in which alternating electric fields having opposite phases by 180° are applied to the above pair of piezoelectric elements 330 located in the right to left direction to generate the out-of-plane oscillation in the vibration plate 320. The dust removing device 310 is driven by the sixth vibration mode. The dust removing device 310 of the present invention is a device capable of effectively removing dust adhering to the surface of the vibration plate by selectively using at least two vibration modes.

Figure 12:
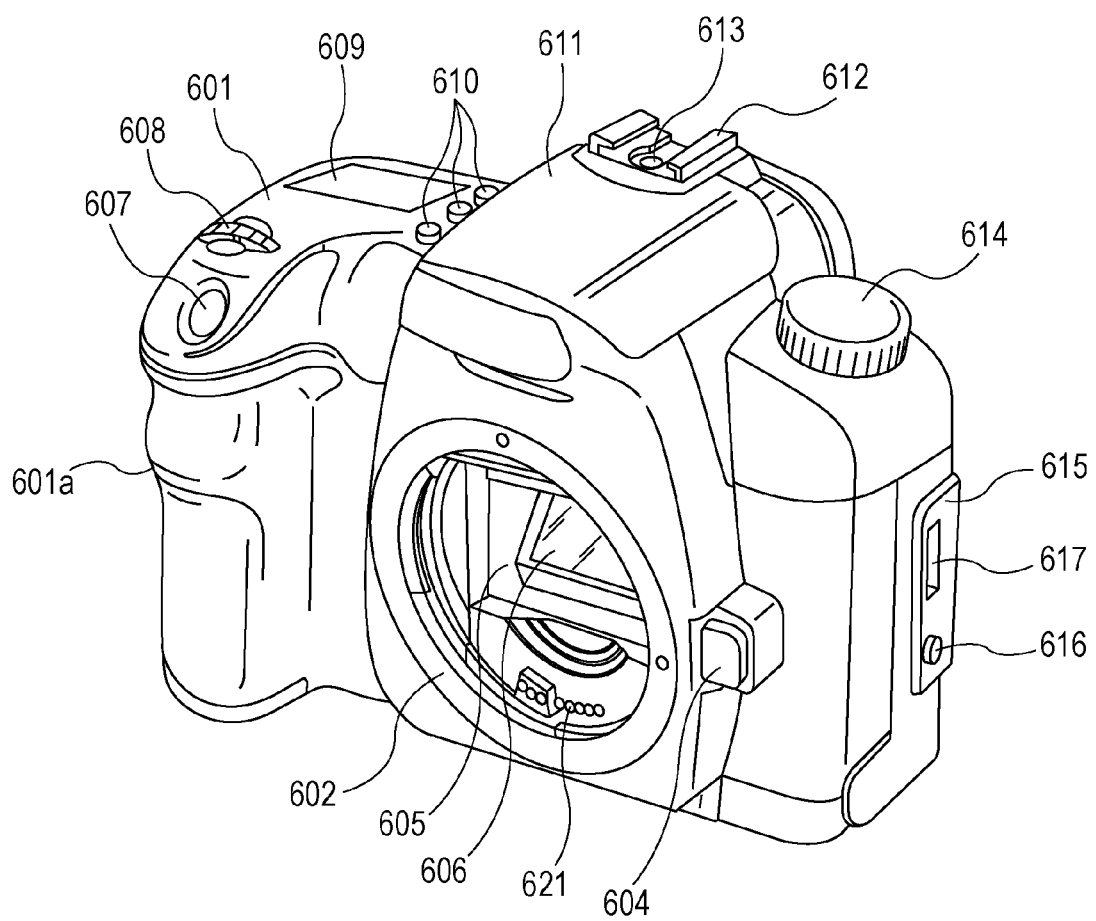
FIG. 12 is a schematic view showing one embodiment of an imaging apparatus of the present invention.
Figure 13:
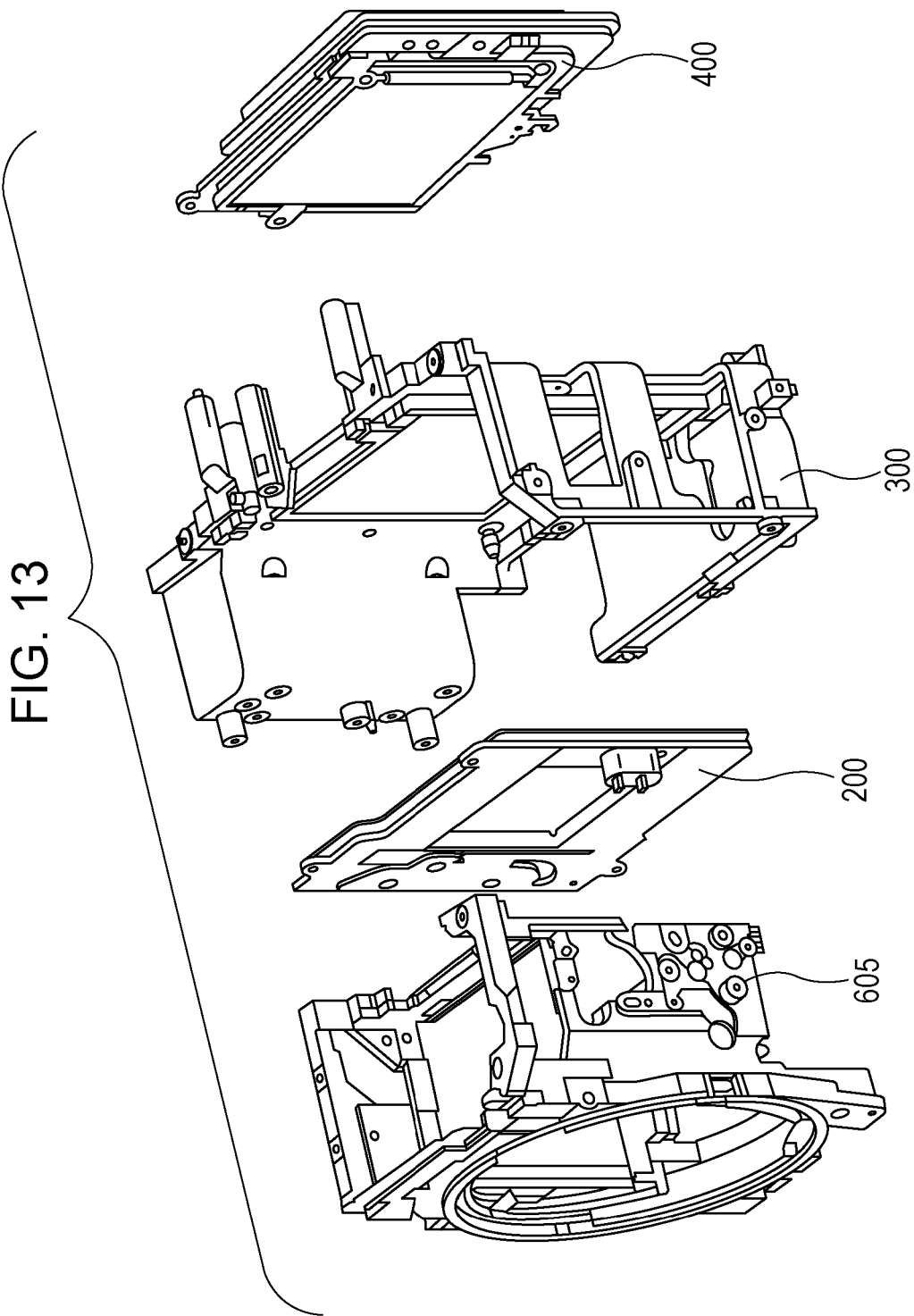
FIG. 13 is a schematic view showing one embodiment of the imaging apparatus of the present invention.

Next, an imaging apparatus of the present invention will be described. The imaging apparatus of the present invention has at least the above dust removing device and an imaging unit and is characterized in that a vibration member of the dust removing device and a light receiving surface of the imaging unit are sequentially provided on the same axis. FIGS. 12 and 13 are views each showing a digital single-lens reflex camera which is one example of a preferable embodiment of the imaging apparatus of the present invention.

FIG. 12 is a front-side perspective view of a camera main body 601 viewed from an object side and shows the state in which an imaging lens unit is dismounted. FIG. 13 is an exploded perspective view showing a schematic structure of the inside of the camera to illustrate the duct removing device of the present invention and a peripheral structure of an imaging unit 400.

In the camera main body 601, there is provided a mirror box 605 into which an image-taking light flux passing through an imaging lens is guided, and a main mirror (quick return mirror) 606 is disposed in the mirror box 605. The main mirror 606 can be maintained at an angle of 45° with respect to the imaging optical axis to guide the image-taking light flux in a pentadach mirror (not shown) direction or can be maintained at a position retracted from the image-taking light flux to guide the image-taking light flux to an imaging apparatus (not shown).

At an object side of a body chassis 300 which functions as a skeleton of the camera body, the mirror box 605 and a shutter unit 200 are arranged in this order from the object side. In addition, at an image-taking person side of the body chassis 300, the imaging unit 400 is disposed. The imaging unit 400 is disposed by adjusting so that an imaging surface of the imaging apparatus is provided parallel to a fitting surface of a mount portion 602, which is used as the baseline to fit the imaging lens unit, with a predetermined space therebetween.

In this case, although the digital single-lens reflex camera has been described as the imaging apparatus of the present invention, for example, an imaging lens unit interchangeable camera, such as a mirrorless digital single lens camera, including no mirror box 605, may also be used. In addition, among various imaging apparatuses, such as imaging lens unit interchangeable video camera, a copying machine, a facsimile, and a scanner, or electronic and electric apparatuses having imaging apparatuses, in particular, the present invention can also be applied to apparatuses which are required to remove dust adhering on the surfaces of optical components thereof.

Next, an electronic apparatus of the present invention will be described. The electronic apparatus of the present invention includes a piezoelectric acoustic component having the piezoelectric element or the multilayered piezoelectric element. As the piezoelectric acoustic components, for example, a speaker, a buzzer, a microphone, and a surface acoustic wave (SAW) element may be mentioned.

Figure 14:
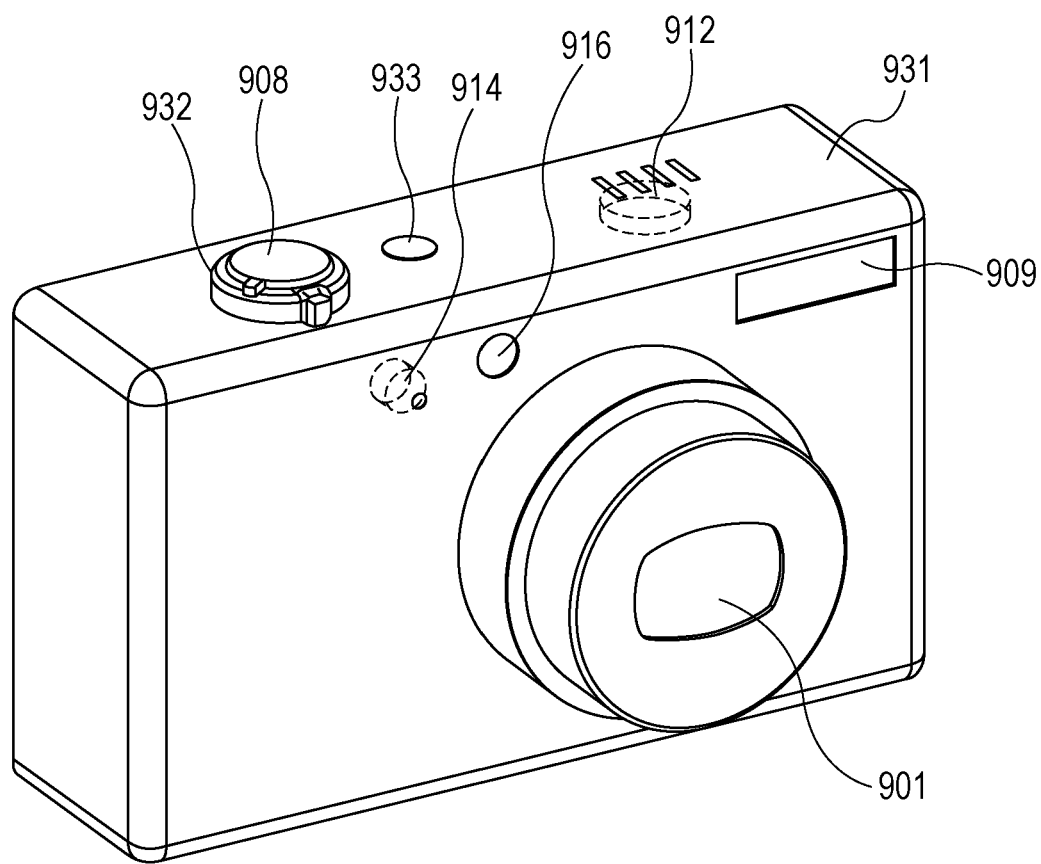
FIG. 14 is a schematic view showing one embodiment of an electronic apparatus of the present invention.

FIG. 14 is a whole perspective view of a main body 931 of a digital camera viewed from a front side thereof which is one example of a preferable embodiment of the electronic apparatus of the present invention. On a front surface of the main body 931, an optical device 901, a microphone 914, a strobe light emission portion 909, and an auxiliary light portion 916 are arranged. Since incorporated in the main body, the microphone 914 is shown by a dotted line. In front of the microphone 914, in order to pick up a sound from the outside, a hole shape is formed.

On an upper surface of the main body 931, an electric power button 933, a speaker 912, a zoom lever 932, and a release button 908 performing a focusing operation are arranged. Since incorporated in the main body 931, the speaker 912 is shown by a dotted line. In front of the speaker 912, in order to send a sound outside, a hole shape is formed.

The piezoelectric acoustic component of the present invention can be used for at least one of the microphone 914, the speaker 914, and the surface acoustic wave element.

In this case, although the digital camera has been described as the electronic apparatus of the present invention, the electronic apparatus of the present invention can also be applied to electronic apparatuses, such as a sound reproduction apparatus, a sound recording apparatus, a mobile phone, and a personal digital assistant, including various piezoelectric acoustic components.

As has thus been described, the piezoelectric element and the multilayered piezoelectric element of the present invention can be preferably applied to a liquid discharge head, a liquid discharge device, an ultrasonic motor, an optical apparatus, a vibration device, a dust removing device, an imaging apparatus, and an electronic apparatus. When the piezoelectric element or the multilayered piezoelectric element of the present invention is used, a liquid discharge head can be provided having a nozzle density and a liquid discharge rate equal to or more than those of a liquid discharge head which uses a lead-containing piezoelectric element.

When the liquid discharge head of the present invention is used, a liquid discharge device can be provided having a liquid discharge rate and discharge accuracy equal to or more than those obtained when a lead-containing piezoelectric element is used. When the piezoelectric element or the multilayered piezoelectric element of the present invention is used, an ultrasonic motor can be provided having a drive force and durability equal to or more than those obtained when a lead-containing piezoelectric element is used.

When the ultrasonic motor of the present invention is used, an optical apparatus can be provided having durability and operation accuracy equal to or more than those obtained when a lead-containing piezoelectric element is used.

When the piezoelectric element or the multilayered piezoelectric element of the present invention is used, a vibration device can be provided having a vibration ability and durability equal to or more than those obtained when a lead-containing piezoelectric element is used.

When the vibration device of the present invention is used, a dust removing device can be provided having dust removing efficiency and durability equal to or more than those obtained when a lead-containing piezoelectric element is used.

When the dust removing device of the present invention is used, an imaging apparatus can be provided having a dust removing function equal to or more than that obtained when a lead-containing piezoelectric element is used.

When a piezoelectric acoustic component including the piezoelectric element or the multilayered piezoelectric element of the present invention is used, an electronic apparatus can be provided having sound generation properties equal to or more than those obtained when a lead-containing piezoelectric element is used.

Besides a liquid discharge head, a motor, and the like, the piezoelectric material of the present invention can also be used for devices, such as an ultrasonic vibrator, a piezoelectric actuator, a piezoelectric sensor, and a ferroelectric memory.

EXAMPLES

Hereinafter, although the piezoelectric material of the present invention will be described in more detail with reference to the following examples, the present invention is not limited thereto.

Piezoelectric materials and intermediates thereof obtained in Examples and Comparative Examples are processed and evaluated by the following procedures.

For the evaluation, the piezoelectric material was processed by a polishing treatment to have a thickness of approximately 0.5 mm. The density of the piezoelectric material was evaluated by Archimedes' method, and when the density thereof was 95% or more of the theoretical value, it was concluded that the crystallization was sufficiently performed. The crystal phase and the lattice constant of the piezoelectric material were evaluated by x-ray diffraction measurement.

Comparative Examples 1 to 3

A metal oxide material for comparison was formed from NN-BT without using a $BiFeO_3$ component. As raw materials, powders of sodium carbonate ($Na_2CO_3$), niobium oxide ($Nb_2O_5$), and barium titanate ($BaTiO_3$) were used. For the powder of barium titanate, a commercially available powder (trade name: BT01, manufactured by Sakai Chemical Industry Co., Ltd.) having a grain diameter of 100 nm was used. When the raw materials were weighed so that the molar ratio of sodium and niobium was 1:1 for synthesis of NN-BT, an impurity phase having a diffraction pattern similar to that of at least one of $Ba_4Nb_2O_9$ (ICDD35-1154), $Ba_6Ti_7Nb_9O_{42}$ (ICDD47-0522), $Ba_3Nb_4Ti_4O_{21}$ (ICDD70-1150), and $Ba_3Nb_{3.2}Ti_5O_{21}$ (ICDD33-0170) was detected in some cases. Hence, when metal oxide materials of Comparative Examples 1 to 3 were formed, the amount of sodium was weighed to be excessive by 3% with respect to a target composition. Hence, the generation of the impurity phase was significantly suppressed.

The raw materials were weighed and mixed together so as to obtain a target composition $Na_zBa_{1-z}Nb_zTi_{1-z}O_3$ (z=0.85, (Comparative Example 1), 0.88, (Comparative Example 2), and 0.90 (Comparative Example 3)). The powder thus mixed was calcined in the air at 1,000° C. to 1,100° C. for 2 to 5 hours. After the calcined powder was pulverized, a binder was added thereto, and granulation was performed. The granulated material was charged in a mold and was compressed, so that a compact having a diameter of 17 mm and a thickness of approximately 1 mm was formed. The obtained compact was fired in the air at a maximum temperature of 1,280° C. for 2 to 6 hours, so that a sintered body was obtained.

By x-ray diffraction, the sample was confirmed to have an approximately single phase of a perovskite structure. The density of the sintered body was 95% or more of the theoretical density. When the composition of the sintered body was evaluated by an inductively coupled plasma spectroscopic analytical method (ICP), the amount of sodium was smaller than that of the target composition by approximately 3%.

Examples 1 to 7

By a method similar to that of Comparative Examples 1 to 3, samples were each formed as the piezoelectric material of the present invention. However, in order to obtain a target composition $(1-x)\{(Na_yBa_{1-z})(Nb_zTi_{1-z})O_3\}\text{-}xBiFeO_3$ (x=0.0010 (Example 1), 0.0025 (Example 2), 0.0050 (Example 3), 0.0075 (Example 4), 0.010 (Example 5), 0.013 (Example 6), and 0.015 (Example 7), y=0.88, and z=0.88), a bismuth ferrite ($BiFeO_3$) powder was weighted and mixed. The bismuth ferrite was formed in advance by mixing commercially available bismuth oxide and iron oxide (III), followed by performing firing at 800° C. for 5 hours. In addition, when bismuth oxide and iron oxide were weighed to obtain a target composition and were then fixed with NN-BT, the same effect as described above was also obtained. A sintered body was obtained by firing a compact in the air at a maximum temperature of 1,160° C. for 1 to 6 hours.

By the x-ray diffraction measurement of the sintered piezoelectric material, the sample was confirmed to have an approximately single phase of a perovskite structure. The density of the piezoelectric material was 95% or more of the theoretical density. When the composition of the sintered body was evaluated by ICP, the amount of sodium was deficient from the target composition by 5% at the most.

Examples 8 to 11

By a method similar to that of Examples 1 to 7, samples were each formed as the piezoelectric material of the present invention. However, a bismuth ferrite ($BiFeO_3$) powder was weighted and mixed so that x=0.0010 (Example 8), 0.0050 (Example 9), 0.013 (Example 10), and 0.015 (Example 11), y=0.85, and z=0.85. A sintered body was obtained by firing a compact in the air at a maximum temperature of 1,160° C. for 1 to 6 hours.

By the x-ray diffraction measurement of the sintered piezoelectric material, the sample was confirmed to have an approximately single phase of a perovskite structure. The density of the piezoelectric material was 95% or more of the theoretical density. When the composition of the sintered body was evaluated by ICP, the amount of sodium was deficient from the target composition by 5% at the most.

Examples 12 to 15

By a method similar to that of Examples 1 to 11, samples were each formed as the piezoelectric material of the present invention. However, a bismuth ferrite ($BiFeO_3$) powder was weighted and mixed so that x=0.0010 (Example 12), 0.0050 (Example 13), 0.013 (Example 14), and 0.015 (Example 15), y=0.90, and z=0.90. A sintered body was obtained by firing a compact in the air at a maximum temperature of 1,160° C. for 1 to 6 hours.

By the x-ray diffraction measurement of the sintered piezoelectric material, the sample was confirmed to have an approximately single phase of a perovskite structure. The density of the piezoelectric material was 95% or more of the theoretical density. When the composition of the sintered body was evaluated by ICP, the amount of sodium was deficient from the target composition by 5% at the most.

Comparative Examples 4 to 6

By a method similar to that of Examples 1 to 15, metal oxide materials for comparison were each formed. However, a powder of the raw material was weighted and mixed so that x=0.020 and y=z=0.88 (Comparative Example 4), 0.85 (Comparative Example 5), and 0.90 (Comparative Example 6). A sintered body was obtained by firing a compact in the air at a maximum temperature of 1,160° C. for 1 to 6 hours.

By the x-ray diffraction measurement of the sintered piezoelectric material, the sample was confirmed to have an approximately single phase of a perovskite structure. The density of the piezoelectric material was 93% or more of the theoretical density. When the composition of the sintered body was evaluated by ICP, the amount of sodium was deficient from the target composition by 5% at the most.

Surfaces of the piezoelectric material of each of Examples 1 to 15 were polished, and in order to remove organic components on the surfaces, a heat treatment was performed in the air at 400° C. to 1,000° C. for 1 hour. On the front surface and the rear surface of the piezoelectric material thus processed, gold electrodes were formed by a DC sputtering method, so that the piezoelectric element of the present invention was formed. This piezoelectric element was machined into a strip shape having a size of 10 mm by 2.5 mm by 0.5 mm, and various properties thereof were evaluated.

For the metal oxide material of each of Comparative Examples 1 to 6, processing similar to that of Examples 1 to 15 was performed to form an element for comparison. By using this element for comparison, various properties were evaluated.

For the measurement of resistivity, a non-polarized element was used. A direct current bias of 10 V was applied between the two electrodes of the element, and the resistivity was obtained by a leak current value measured after 20 seconds from the voltage application. When this resistivity was 1 GΩ·cm or more and preferably 100 GΩ·cm or more, sufficient insulating properties were obtained in practical use of the piezoelectric material and the piezoelectric element.

Before the evaluation of the piezoelectric properties, the sample was processed by a polarization treatment. In particular, after the sample was heated to 100° C. to 150° C. in an oil bath, a voltage of 20 kV/cm was applied to the sample for 30 min, and the sample was cooled to room temperature while the voltage was applied.

The piezoelectric constant ($d_{31}$) and the mechanical quality factor (Qm) of the piezoelectric material were evaluated by a resonance-antiresonance method using the above strip-shaped piezoelectric element. The piezoelectric constant ($d_{33}$) of the piezoelectric element was evaluated by the Berlincourt method. For Curie temperature measurement, a temperature at which the relative dielectric constant was maximized was measured and was regarded as the Curie temperature.

Table 1 shows the resistivity, the piezoelectric constant ($d_{31}$), the piezoelectric constant ($d_{33}$), and the Curie temperature of the piezoelectric element obtained from the piezoelectric material of each of Examples 1 to 15 and those of the element obtained from the metal oxide material of each of Comparative Examples 1 to 6. The value of the piezoelectric constant $d_{31}$ indicates the absolute value.

TABLE 1

| | TARGET COMPOSITION (1 − x)(NN-BT)-xBFO | | | RESISTIVITY [GΩcm] | PIEZOELECTRIC CONSTANT d31 [pC/N] | PIEZOELECTRIC CONSTANT d33 [pC/N] | CURIE TEMPERATURE [° C.] |
|---|---|---|---|---|---|---|---|
| | x | y | z | | | | |
| COMPARATIVE EXAMPLE 1 | 0 | 0.88 | 0.88 | 50 | 43.2 | 120 | 200 |
| EXAMPLE 1 | 0.0010 | 0.88 | 0.88 | 157 | 55.3 | 140 | 195 |
| EXAMPLE 2 | 0.0025 | 0.88 | 0.88 | 164 | 55.8 | 146 | 185 |
| EXAMPLE 3 | 0.0050 | 0.88 | 0.88 | 390 | 53.9 | 161 | 180 |
| EXAMPLE 4 | 0.0075 | 0.88 | 0.88 | 159 | 53 | 169 | 155 |
| EXAMPLE 5 | 0.0100 | 0.88 | 0.88 | 236 | 47.5 | 155 | 140 |
| EXAMPLE 6 | 0.0130 | 0.88 | 0.88 | 198 | 47.5 | 154 | 130 |
| EXAMPLE 7 | 0.0150 | 0.88 | 0.88 | 154 | 47.4 | 158 | 110 |
| COMPARATIVE EXAMPLE 4 | 0.0200 | 0.88 | 0.88 | 23 | 53 | 190 | 70 |
| COMPARATIVE EXAMPLE 2 | 0 | 0.85 | 0.85 | 45 | 41.6 | 122 | 160 |
| EXAMPLE 8 | 0.0010 | 0.85 | 0.85 | 124 | 46.4 | 124 | 156 |
| EXAMPLE 9 | 0.0050 | 0.85 | 0.85 | 150 | 66.7 | 155 | 145 |
| EXAMPLE 10 | 0.0130 | 0.85 | 0.85 | 150 | 61.2 | 147 | 130 |
| EXAMPLE 11 | 0.0150 | 0.85 | 0.85 | 151 | 56.1 | 143 | 105 |
| COMPARATIVE EXAMPLE 5 | 0.0200 | 0.85 | 0.85 | 15 | 59.9 | 148 | 60 |
| COMPARATIVE EXAMPLE 3 | 0 | 0.90 | 0.90 | 113 | 44.1 | 133 | 240 |
| EXAMPLE 12 | 0.0010 | 0.90 | 0.90 | 308 | 49.8 | 148 | 235 |
| EXAMPLE 13 | 0.0050 | 0.90 | 0.90 | 380 | 73.3 | 178 | 215 |
| EXAMPLE 14 | 0.0130 | 0.90 | 0.90 | 365 | 72.2 | 171 | 190 |
| EXAMPLE 15 | 0.0150 | 0.90 | 0.90 | 357 | 70.6 | 165 | 135 |
| COMPARATIVE EXAMPLE 6 | 0.0200 | 0.90 | 0.90 | 88 | 68.6 | 160 | 105 |

*The above compositions are each a target composition, and after sintering, Na is deficient in some cases.
(Note 1) "Target composition (1 − x) (NN-BT)-xBFO" indicates "target composition (1 − x) {(Na$_y$Ba$_{1-z}$) (Nb$_z$Ti$_{1-z}$) O$_3$}—xBiFeO$_3$".

From Table 1, it was found that when bismuth ferrite was added to NN-BT, the piezoelectric constant ($d_{31}$) and the piezoelectric constant ($d_{33}$) were increased. However, as in the case of Comparative Examples 4 to 6, when x was 0.020, although the piezoelectric constant was higher than that obtained when no bismuth ferrite was added, the Curie temperature was excessively decreased, and as a result, the metal oxide material was not practically used. In addition, it was found that when comparison was performed between Comparative Example 1 and Examples 1 to 7, Comparative Example 2 and Examples 8 to 11, and Comparative Example 3 and Examples 12 to 15, by addition of bismuth ferrite to NN-BT, the resistivity was also improved.

In addition, although not shown in Table 1, the mechanical quality factor (Qm) was also evaluated by a resonance-antiresonance method. The mechanical quality factors of Examples 1 to 15 were all 280 or more and were each sufficient as a resonance type piezoelectric element.

Example 16

As in the case of Example 4, after powders of the raw materials were wet-mixed and were then dehydrated and dried, calcination was performed at 1,000° C. to 1,100° C., so that a calcined material was obtained. After an organic binder was added to the calcined material thus obtained, sheet formation was performed by a doctor blade method, and green sheets each having a thickness of 50 μm were obtained.

A conductive paste for internal electrodes was printed on the green sheets. As the conductive paste, an alloy of 70% of Ag and 30% of Pd was used. Next, after 9 pieces of the green sheets thus formed, on each of which the conductive paste was applied, were laminated to each other, a laminate thus formed was fired at 1,140° C. to form a sintered body. After the sintered body thus obtained was cut into a size of 10 mm by 2.5 mm, the side surfaces thereof were polished, and a pair of external electrodes (a first electrode and a second electrode) each short-circuiting internal electrodes alternately located at one side was formed by Au sputtering, so that a multilayered piezoelectric element as shown in FIG. 2B was formed.

When the internal electrodes of the multilayered piezoelectric element thus obtained were observed, Ag—Pd layers each functioning as an electrode layer were alternately formed with the piezoelectric material layers provided therebetween.

A polarization treatment was performed on the sample before the piezoelectric properties were evaluated. In particular, after the sample was heated to 100° C. to 150° C. on a hot plate, a voltage of 20 kV/cm was applied between the first electrode and the second electrode for 30 minutes, and the sample was cooled to room temperature while the voltage was applied.

When the piezoelectric properties were evaluated, it was found that sufficient insulating properties and excellent piezoelectric properties equivalent to those of the piezoelectric material of Example 4 could be obtained.

Comparative Example 7

As in the case of Comparative Example 1, after powders of the raw materials were wet-mixed and were then dehydrated and dried, calcination was performed at 1,000° C. to 1,100° C., so that a calcined material was obtained. After an organic binder was added to the calcined material thus obtained, sheet formation was performed by a doctor blade method, and green sheets each having a thickness of 50 μm were obtained.

A conductive paste for internal electrodes was printed on the green sheets. As the conductive paste, an alloy of 70% of Ag and 30% of Pd was used. Next, after 9 pieces of the green sheets thus formed, on each of which the conductive paste was applied, were laminated to each other, a laminate thus formed was fired at 1,280° C., so that a sintered body was obtained. The sintered body thus obtained was machined as in the case of Example 16, so that a multilayered piezoelectric element as shown in FIG. 2B was formed.

When the internal electrodes of the multilayered piezoelectric element thus obtained were observed, Ag—Pd used as the electrode material was melted, and Ag and Pd were diffused into the piezoelectric material layers. In addition, since the resistivity of the element between the pair of external electrodes was low, such as $10^6$ $\Omega\cdot$cm or less, the piezoelectric constant could not be measured.

Comparative Example 8

As in the case of Comparative Example 7, green sheets each having a thickness of 50 µm were obtained.

A conductive paste for internal electrodes was printed on the green sheets. As the conductive paste, an alloy of 70% of Ag and 30% of Pd was used. Next, after 9 pieces of the green sheets thus formed, on each of which the conductive paste was applied, were laminated to each other, a laminate thus formed was fired at 1,140° C., so that a sintered body was obtained. The sintered body thus obtained was machined as in the case of Example 16, so that a multilayered piezoelectric element as shown in FIG. 2B was formed.

When the internal electrodes of the multilayered piezoelectric element thus obtained were observed, Ag—Pd layers each functioning as the electrode layer were alternately formed with the piezoelectric material layers provided therebetween. However, since the sintered density of the piezoelectric material layer was insufficient, the resistivity of the element between the pair of external electrodes was low, such as $10^8$ $\Omega\cdot$cm or less, the piezoelectric constant $d_{31}$ could not be detected, and the piezoelectric constant $d_{33}$ was lower than 10 pC/N.

Example 17

By using the piezoelectric element of Example 4, the liquid discharge head shown in FIG. 3 was formed. Discharge of an ink following an inputted electric signal was confirmed.

Example 18

By using the liquid discharge head of Example 17, the liquid discharge device shown in FIG. 4 was formed. Discharge of an ink following an inputted electric signal was confirmed on a recording medium.

Example 19

By using the piezoelectric element of Example 4, the ultrasonic motor shown in FIG. 6B was formed. Rotation of the motor in accordance with application of an alternating voltage was confirmed.

Example 20

By using the ultrasonic motor of Example 19, the optical apparatus shown in FIG. 7 was formed. The autofocus operation in accordance with application of an alternating voltage was confirmed.

Example 21

By using the piezoelectric element of Example 4, the dust removing device shown in FIG. 9 was formed. When plastic beads were scattered, and an alternating voltage was applied, an excellent dust removing rate was confirmed.

Example 22

By using the dust removing device of Example 21, the imaging apparatus shown in FIG. 12 was formed. When the imaging apparatus was operated, dust on the surface of the imaging unit was preferably removed, and an image having no dust-relating defects was obtained.

Example 23

By using the multilayered piezoelectric element of Example 16, the liquid discharge head shown in FIG. 3 was formed. Discharge of an ink following an inputted electric signal was confirmed.

Example 24

By using the liquid discharge head of Example 23, the liquid discharge device shown in FIG. 4 was formed. Discharge of an ink following an inputted electric signal was confirmed on a recording medium.

Example 25

By using the multilayered piezoelectric element of Example 16, the ultrasonic motor shown in FIG. 6B was formed. Rotation of the motor in accordance with application of an alternating voltage was confirmed.

Example 26

By using the ultrasonic motor of Example 25, the optical apparatus shown in FIG. 7 was formed. The autofocus operation in accordance with application of an alternating voltage was confirmed.

Example 27

By using the multilayered piezoelectric element of Example 16, the dust removing device shown in FIG. 9 was formed. When plastic beads were scattered, and an alternating voltage was applied, an excellent dust removing rate was confirmed.

Example 28

By using the dust removing device of Example 27, the imaging apparatus shown in FIG. 12 was formed. When the imaging apparatus was operated, dust on the surface of the imaging unit was preferably removed, and an image having no dust-relating defects was obtained.

Example 29

By using the multilayered piezoelectric element of Example 16, the electronic apparatus shown in FIG. 14 was formed. The speaker operation in accordance with application of an alternating voltage was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-235205, filed Oct. 26, 2011 and No.

2012-221969 filed Oct. 4, 2012, which are hereby incorporated by reference herein in their entirety.

INDUSTRIAL APPLICABILITY

The piezoelectric material of the present invention shows preferable piezoelectric properties even at a high environmental temperature. Since containing no lead, the piezoelectric material of the present invention has a small load on the environment. Hence, the lead-free piezoelectric material of the present invention can be applied to apparatuses, such as a liquid discharge head, an ultrasonic motor, and a dust removing device, which use a large amount of a piezoelectric material, without causing any problems.

REFERENCE SIGNS LIST 1 first electrode
2 piezoelectric material
3 second electrode
101 piezoelectric element
102 individual liquid chamber
103 vibration plate
104 liquid chamber partition
105 ejection port
106 communicating hole
107 common liquid chamber
108 buffer layer
1011 first electrode
1012 piezoelectric material
1013 second electrode
201 vibrator
201 rotor
203 output shaft
204 vibrator
205 rotor
206 spring
2011 elastic ring
2012 piezoelectric element
2013 organic adhesive
2041 metal elastic body
2042 multilayered piezoelectric element
310 dust removing device
320 vibration plate
330 piezoelectric element
331 piezoelectric material
332 first electrode
333 second electrode
336 first electrode surface
337 second electrode surface
51 first electrode
53 second electrode
54 piezoelectric material layer
55 internal electrode
501 first electrode
503 second electrode
504 piezoelectric material layer
505 internal electrode
506a external electrode
506b external electrode
601 camera main body
602 mount portion
605 mirror box
606 main mirror
200 shutter unit
300 body chassis
400 imaging unit
701 front group lens
702 rear group lens (focus lens)
711 detachable mount
712 fixed barrel
713 linear guide barrel
714 front lens group barrel
715 cam ring
716 rear lens group barrel
717 cam roller
718 shaft screw
719 roller
720 rotation transmission ring
722 roller
724 manual focus ring
725 ultrasonic motor
726 wave washer
727 ball race
728 focus key
729 joint member
732 washer
733 low friction sheet
881 liquid discharge device
882 exterior
883 exterior
884 exterior
885 exterior
887 exterior
890 recovery portion
891 recording portion
892 carriage
896 device main body
897 automatic feed portion
898 ejection port
899 transport unit
901 optical device
908 release button
909 strobe light emission portion
912 speaker
914 microphone
916 auxiliary light portion
931 main body
932 zoom lever
933 electric power button

The invention claimed is:

1. A piezoelectric material comprising:
a perovskite-type metal oxide represented by the following general formula (1)

$$(1-x)\{(Na_yBa_{1-y})(Nb_zTi_{1-z})O_3\}\text{-}xBiFeO_3 \qquad (1)$$

wherein in the formula, $0<x\le0.015$, $0.80\le y\le0.95$, and $0.85\le z\le0.95$ hold.

2. The piezoelectric material according to claim 1, wherein the piezoelectric material has a Curie temperature of 110° C. or more.

3. A piezoelectric element comprising:
a first electrode;
a piezoelectric material (portion); and
a second electrode,
wherein the piezoelectric material is the piezoelectric material according to claim 1.

4. A liquid discharge head comprising:
a liquid chamber communicating with an ejection port;
a vibration portion; and
the piezoelectric element according to claim 3.

5. A liquid discharge device comprising:
a transport unit for a recording medium; and
the liquid discharge head according to claim 4.

6. An ultrasonic motor comprising:
a vibration body including the piezoelectric element according to claim 3; and
a moving body in contact with the vibration body.

7. An optical apparatus comprising:
the ultrasonic motor according to claim 6 in a drive portion.

8. A vibration device comprising:
a vibration body; and
the piezoelectric element according to claim 3.

9. A dust removing device comprising:
the vibration device according to claim 8 in a vibration portion.

10. An imaging apparatus comprising:
the dust removing device according to claim 9; and
an imaging unit having a light receiving surface,
wherein the vibration body in the dust removing device and the light receiving surface of the imaging unit are sequentially provided on the same axis.

11. An electronic apparatus comprising:
a piezoelectric acoustic component including the piezoelectric element according to claim 3.

12. A multilayered piezoelectric element comprising:
piezoelectric material layers; and
electrode layers including at least one internal electrode, the piezoelectric material layers and the electrode layers being alternately laminated to each other,
wherein the piezoelectric material layers include the piezoelectric material according to claim 1.

13. The multilayered piezoelectric element according to claim 12,
wherein the internal electrode includes Ag and Pd, and
a ratio (M1/M2) of a weight M1 of the Ag to a weight M2 of the Pd is in a range of 1.5 to 9.0.

14. The multilayered piezoelectric element according to claim 12, wherein the internal electrode includes at least one of Ni and Cu.

15. A liquid discharge head comprising:
a liquid chamber communicating with an ejection port;
a vibration portion; and
the multilayered piezoelectric element according to claim 12.

16. A liquid discharge device comprising:
a transport unit for a recording medium; and
the liquid discharge head according to claim 15.

17. An ultrasonic motor comprising:
a vibration body including the multilayered piezoelectric element according to claim 12; and
a moving body in contact with the vibration body.

18. An optical apparatus comprising:
the ultrasonic motor according to claim 17 in a drive portion.

19. A vibration device comprising:
a vibration body; and
the multilayered piezoelectric element according to claim 12.

20. A dust removing device comprising:
the vibration device according to claim 19 in a vibration portion.

21. An imaging apparatus comprising:
the dust removing device according to claim 20; and
an imaging unit having a light receiving surface,
wherein the vibration body in the dust removing device and the light receiving surface of the imaging unit are sequentially provided on the same axis.

22. An electronic apparatus comprising:
a piezoelectric acoustic component including the multilayered piezoelectric element according to claim 12.

* * * * *